US010440584B1

(12) United States Patent
Labadie et al.

(10) Patent No.: US 10,440,584 B1
(45) Date of Patent: Oct. 8, 2019

(54) MILLIMETER-WAVE RADIO ARCHITECTURE FOR MULTI-CHANNEL CONCURRENT OPERATION

(71) Applicant: Amazon Technologies, Inc., Seattle, WA (US)

(72) Inventors: Nathan Labadie, Santa Clara, CA (US); Cheol Su Kim, San Jose, CA (US)

(73) Assignee: Amazon Technologies, Inc., Seattle, WA (US)

( * ) Notice: Subject to any disclaimer, the term of this patent is extended or adjusted under 35 U.S.C. 154(b) by 0 days.

(21) Appl. No.: 15/714,459

(22) Filed: Sep. 25, 2017

(51) Int. Cl.
| | |
|---|---|
| H04W 16/14 | (2009.01) |
| H03H 7/12 | (2006.01) |
| H04B 7/06 | (2006.01) |
| H04W 88/10 | (2009.01) |
| H04B 7/0452 | (2017.01) |
| H04L 5/00 | (2006.01) |

(52) U.S. Cl.
CPC .............. H04W 16/14 (2013.01); H03H 7/12 (2013.01); H04B 7/0452 (2013.01); H04B 7/0617 (2013.01); H04W 88/10 (2013.01); H04L 5/0007 (2013.01); H04L 5/0041 (2013.01)

(58) Field of Classification Search
None
See application file for complete search history.

(56) References Cited

U.S. PATENT DOCUMENTS

| | | | | |
|---|---|---|---|---|
| 8,644,765 | B1 * | 2/2014 | Zhang | H04B 7/0417 455/63.4 |
| 8,843,076 | B2 * | 9/2014 | Trainin | H04W 24/00 455/67.11 |
| 9,197,982 | B2 * | 11/2015 | Moshfeghi | H04W 84/00 |
| 9,226,092 | B2 * | 12/2015 | Moshfeghi | H04W 84/00 |
| 9,253,587 | B2 * | 2/2016 | Moshfeghi | H04W 84/00 |
| 9,326,273 | B2 * | 4/2016 | Maltsev | H04W 72/0406 |
| 9,332,399 | B2 * | 5/2016 | Tetteh | H04W 4/06 |
| 9,386,465 | B2 * | 7/2016 | Forenza | H04B 7/0626 |
| 9,402,244 | B2 * | 7/2016 | Merlin | H04W 72/005 |

(Continued)

FOREIGN PATENT DOCUMENTS

| | | | | |
|---|---|---|---|---|
| WO | WO 2015051701 | A1 * | 4/2015 | H04W 48/16 |
| WO | WO-2015051701 | A1 * | 4/2015 | H04W 48/16 |

*Primary Examiner* — Berhanu Tadese
(74) *Attorney, Agent, or Firm* — Lowenstein Sandler LLP

(57) ABSTRACT

Technology for radios that support single channel, multi-channel, SISO, MIMO, and beamforming communications at millimeter wave frequencies using WLAN transceivers or other IF transceivers. One radio includes a first transceiver configured to generate a first RF signal in a first frequency range; a second transceiver configured to generate a third RF signal in a mm-wave frequency range, the second transceiver is configured to couple to a multi-element antenna for beamforming operations; and conversion circuitry coupled to an output of the first transceiver and an input of the second transceiver. The conversion circuitry is configured to receive the first RF signal from the first transceiver and convert the first RF signal in the first frequency range to a second RF signal in the mm-wave frequency range; and receive the third RF signal from the second transceiver and convert the third RF signal to a fourth RF signal in the first frequency range.

20 Claims, 9 Drawing Sheets

(56) References Cited

U.S. PATENT DOCUMENTS

| | | | | |
|---|---|---|---|---|
| 9,525,472 B2* | 12/2016 | George | | H04B 7/0469 |
| 9,548,805 B2* | 1/2017 | Moshfeghi | | H04W 84/00 |
| 9,667,330 B2* | 5/2017 | Liang | | H04B 7/0452 |
| 9,680,554 B2* | 6/2017 | Moshfeghi | | H04W 84/00 |
| 9,692,577 B2* | 6/2017 | Liang | | H04W 72/0453 |
| 9,729,267 B2* | 8/2017 | Rosenfelder | | H04J 14/0256 |
| 9,813,127 B2* | 11/2017 | George | | H04B 7/0413 |
| 9,819,403 B2* | 11/2017 | Forenza | | H04B 7/01 |
| 9,825,654 B2* | 11/2017 | Li | | H04B 1/0017 |
| 9,826,537 B2* | 11/2017 | Forenza | | H04B 17/318 |
| 9,847,819 B2* | 12/2017 | Zhu | | H04L 5/14 |
| 9,923,620 B2* | 3/2018 | Moshfeghi | | H04W 84/00 |
| 9,929,786 B2* | 3/2018 | George | | H04B 7/0469 |
| 2005/0249236 A1* | 11/2005 | Walden | | H04L 1/0061 370/465 |
| 2006/0045113 A1* | 3/2006 | Palisca | | H04W 48/18 370/431 |
| 2008/0318524 A1* | 12/2008 | Rofougaran | | H01Q 1/2225 455/41.1 |
| 2012/0009880 A1* | 1/2012 | Trainin | | H04W 24/00 455/67.11 |
| 2014/0044041 A1* | 2/2014 | Moshfeghi | | H04W 84/00 370/328 |
| 2014/0044042 A1* | 2/2014 | Moshfeghi | | H04W 84/00 370/328 |
| 2014/0044043 A1* | 2/2014 | Moshfeghi | | H04W 84/00 370/328 |
| 2014/0045478 A1* | 2/2014 | Moshfeghi | | H04W 84/00 455/418 |
| 2014/0206368 A1* | 7/2014 | Maltsev | | H04W 72/0406 455/450 |
| 2016/0044704 A1* | 2/2016 | Li | | H04W 4/70 370/330 |
| 2016/0142114 A1* | 5/2016 | Moshfeghi | | H04W 84/00 370/312 |
| 2016/0202344 A1* | 7/2016 | Sanderovich | | G01S 5/06 455/456.1 |
| 2016/0211905 A1* | 7/2016 | Moshfeghi | | H04W 84/00 |
| 2016/0234626 A1* | 8/2016 | Ray | | H04L 67/104 |
| 2016/0241323 A1* | 8/2016 | Ko | | H04B 7/0691 |
| 2016/0308559 A1* | 10/2016 | Li | | H04B 1/0017 |
| 2017/0033847 A1* | 2/2017 | Lomayev | | H04B 7/0413 |
| 2017/0156069 A1* | 6/2017 | Moshfeghi | | H04W 84/00 |
| 2017/0163333 A1* | 6/2017 | Breiling | | H04B 7/15592 |
| 2017/0164367 A1* | 6/2017 | Manolakos | | H04W 72/0453 |
| 2017/0207830 A1* | 7/2017 | Lomayev | | H04B 7/0413 |
| 2017/0264351 A1* | 9/2017 | Lomayev | | H04L 5/001 |
| 2017/0265217 A1* | 9/2017 | Lomayev | | H04B 7/04 |
| 2017/0317734 A1* | 11/2017 | Moshfeghi | | H04W 84/00 |
| 2018/0054847 A1* | 2/2018 | Cariou | | H04W 76/15 |
| 2018/0091201 A1* | 3/2018 | Yang | | H04B 7/0602 |
| 2018/0254805 A1* | 9/2018 | Sadri | | H04B 7/0413 |

* cited by examiner

US 10,440,584 B1

MILLIMETER-WAVE RADIO ARCHITECTURE FOR MULTI-CHANNEL CONCURRENT OPERATION

BACKGROUND

A large and growing population of users is enjoying entertainment through the consumption of digital media items, such as music, movies, images, electronic books, and so on. The users employ various electronic devices to consume such media items. Among these electronic devices (referred to herein as user devices or user equipment) are electronic book readers, cellular telephones, personal digital assistants (PDAs), portable media players, tablet computers, netbooks, laptops, and the like. These electronic devices wirelessly communicate with a communications infrastructure to enable the consumption of the digital media items. In order to wirelessly communicate with other devices, these electronic devices include one or more antennas.

BRIEF DESCRIPTION OF DRAWINGS

The present inventions will be understood more fully from the detailed description given below and from the accompanying drawings of various embodiments of the present invention, which, however, should not be taken to limit the present invention to the specific embodiments, but are for explanation and understanding only.

DETAILED DESCRIPTION

Figure 1:
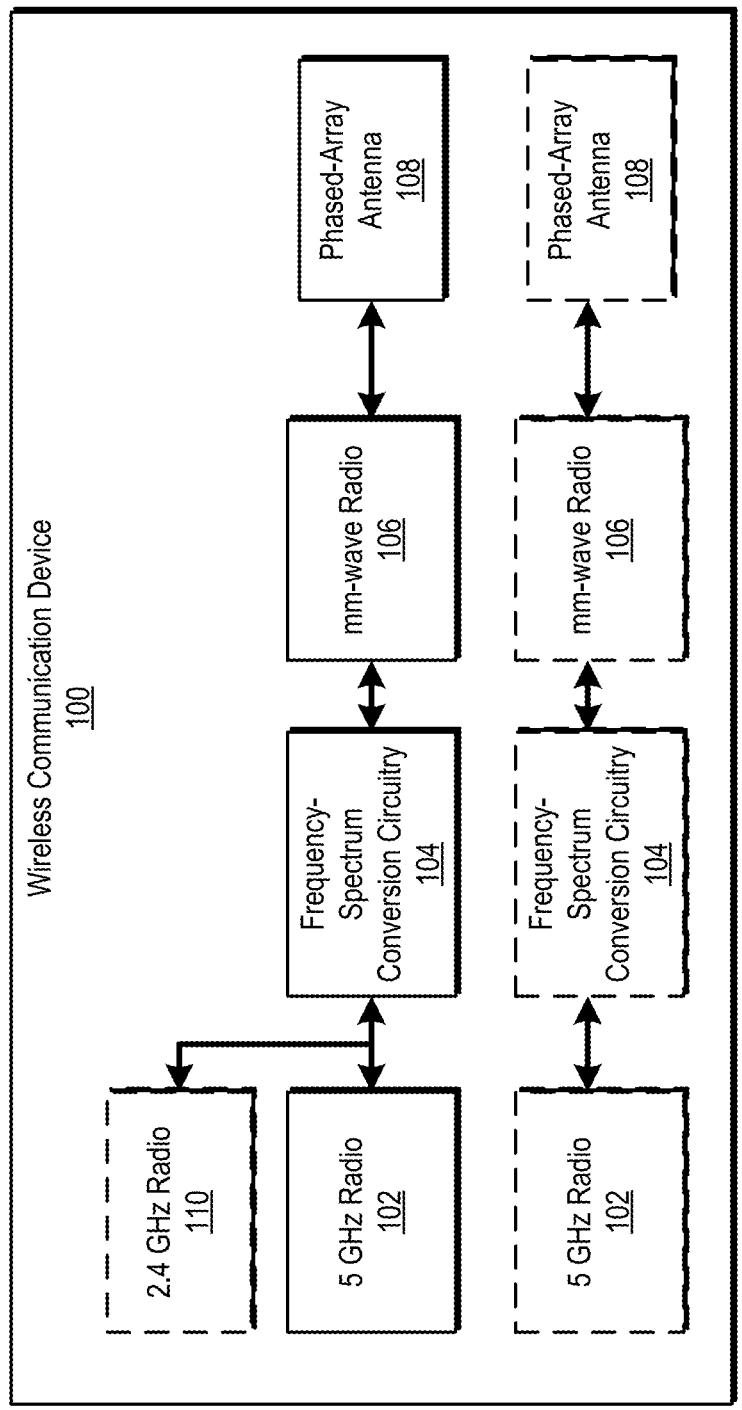
FIG. 1 is a block diagram of a wireless communication device with multiple radios and frequency-spectrum converter circuitry according to one embodiment.

Technology for radios that support single channel, multi-channel, single-input-single-output (SISO), multiple-input-multiple output (MIMO), and beamforming communications at millimeter wave (mm-wave) frequencies using WLAN transceivers or other IF transceivers. In some embodiments, the radio includes conversion circuitry coupled between a first transceiver that operates in a first frequency range (e.g., WLAN RF frequencies) and a second transceiver that operates in a second frequency range (e.g., mm-wave RF frequencies). In one embodiment, a radio includes a first transceiver configured to generate RF signals in a first frequency range; a second transceiver configured to generate RF signals in a millimeter-wave (mm-wave) frequency range, the second transceiver is configured to couple to a multi-element antenna for beamforming operations; and conversion circuitry coupled to an output of the first transceiver and an input of the second transceiver. The conversion circuitry may also be bi-directional. In one embodiment, the conversion circuitry is configured to convert first transmit (TX) RF signals in the first frequency range to second TX RF signals in the mm-wave frequency spectrum on a TX path between the first transceiver and the second transceiver; and convert first receive (RX) RF signals in the mm-wave frequency spectrum to second RX RF signals in the first frequency range on a RX path between the second transceiver and the first transceiver. In a further embodiment, the conversion circuitry is further configured to convert the first TX RF signals to first intermediate frequency (IF) signals in an IF frequency range on the TX path to obtain the second TX RF signals in the mm-wave frequency range on the TX path and convert the first RX RF signals to second IF signals in the IF frequency range on the RX path to obtain the second RX RF signals in the first frequency range on the RX path. For example, in the TX path, the conversion circuitry can receive a TX RF signal in the first frequency range, convert the transmit RF signal to an IF signal and output the IF signal to an input of the second transceiver. The second transceiver generates an mm-wave signal based on the IF signal. The mm-wave signal, when applied to a multi-element antenna for beamforming operation, causes the multi-element antenna to radiate electromagnetic energy in an mm-wave frequency spectrum. In the RX path, the second transceiver receives an mm-wave signal via the antenna elements and outputs the mm-wave signal to the conversion circuitry as an IF signal. The conversion circuitry converts the IF signal to a RX signal in the first frequency range and outputs the RX signal to the first transceiver. It should be noted that TX signals and RX signals are used to differentiate between signals that are being transmitted by the wireless communication device and signals that are being received by the wireless communication device. It should be noted that although some signals are designated as RF signals, these signals could be considered IF signals since these signals are not actually transmitted or received by the wireless communication device. The RF signals in some cases indicate signals that are output by the WLAN transceiver, but are input into the mm-wave transceiver rather than being actually transmitted as RF signals in the WLAN domain.

Figure 2:
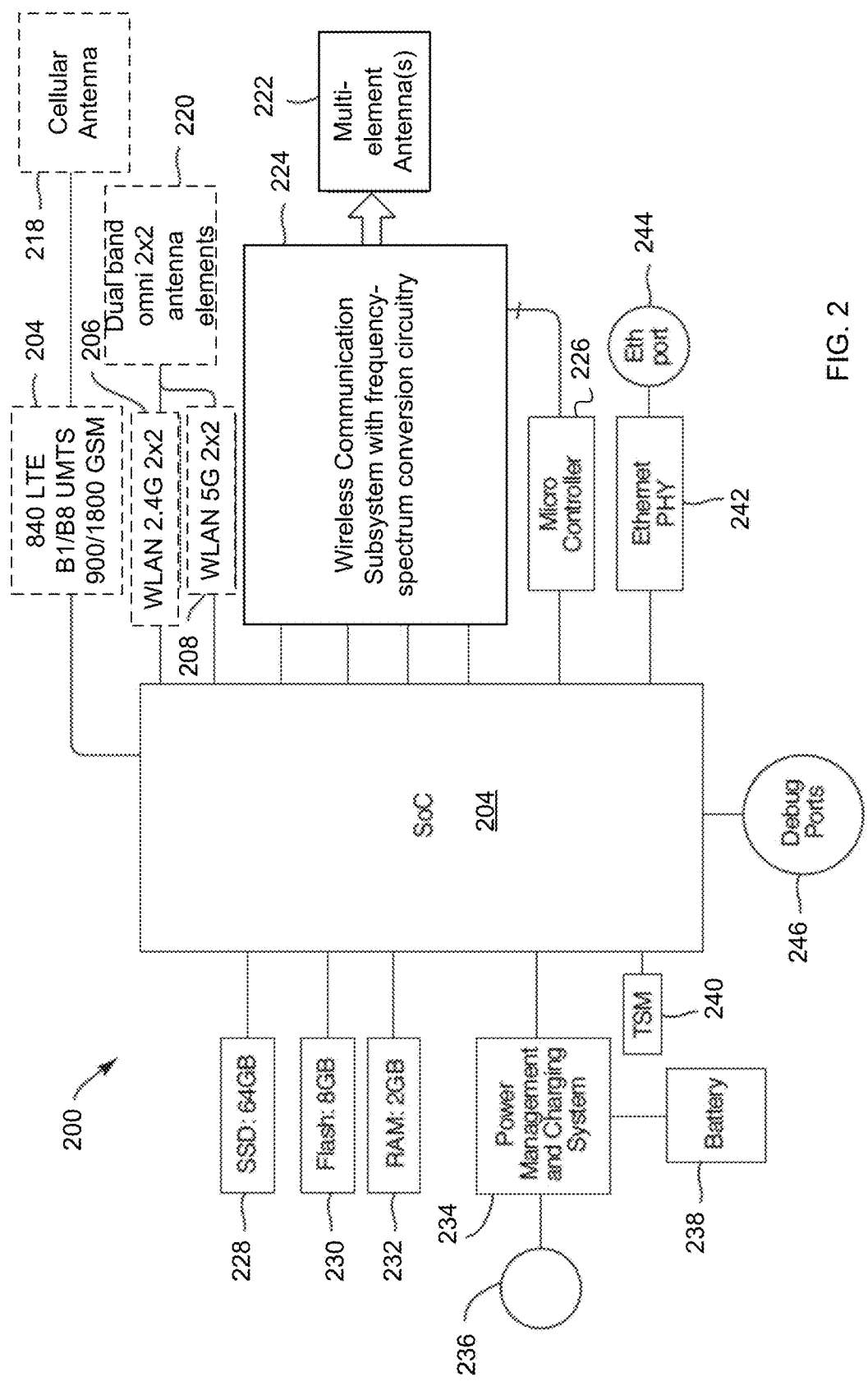
FIG. 2 is a block diagram of a wireless communication subsystem of an electronic device according to one embodiment.

FIGS. 1-2 are generally directed to wireless communication devices including multiple transceivers that support single channel, multi-channel, SISO, MIMO, and beamforming communications mm-wave frequencies using WLAN transceivers or other IF transceivers or a wireless communication subsystem of an electronic device having the same. FIGS. 3-8 are generally directed to embodiments of a radio that supports multi-channel, SISO, MIMO, and beamforming communications at millimeter wave (mm-wave) frequencies using WLAN transceivers or other IF transceivers. FIG. 9 shows an electronic device with a WLAN transceiver, mm-wave transceiver, and frequency-conversion circuitry.

FIG. 1 is a block diagram of a wireless communication device 300 with multiple radios and frequency-spectrum converter circuitry according to one embodiment. The wireless communication device 300 includes a 5 GHz radio 102, a frequency-spectrum conversion circuitry 104, a mm-wave radio 106, a phased-array antenna 108, and an optional 2.4 GHz radio 110. Alternatively, different number of radios may be used. For example, as described in various embodiments, a first number of WLAN radios may be used in connection with a second number of mm-wave radios for multi-channel modes, MIMO TDD, MIMO FDD, or the like. There are other embodiments, where different wireless other than WLAN may be used.

In one embodiment, the wireless communication device 100 includes a second set of 5 GHz radio 102, frequency-spectrum conversion circuitry 104, mm-wave radio 106, and phased-array antenna 108, as illustrated in FIG. 1 with dashed lines. The second set can be used for various multi-channel modes as described herein with respect to FIGS. 3-8. In another embodiment, instead of the 5 GHz radio 102, a 2.4 GHz radio 110 can be used in connection with the frequency-spectrum conversion circuitry 104 and mm-wave radio 106, as illustrated in FIG. 1 with dashed lines. Alternatively, N number of WLAN radios 102 may be used in connection with the frequency-spectrum conversion circuitry 104 and M number of mm-wave radios 106. In one embodiment, the mm-wave radio 106 is coupled to the phased-array antenna 108 as illustrated in FIG. 1. In other embodiments, the mm-wave radio 106 can be coupled to other types of multi-element antennas.

It should be noted that any of the radios in wireless communication device 100 in FIG. 1 may be any of the radios as described below with respect to FIGS. 3-8.

In one embodiment, the wireless communication device 100 includes a radio that is configured for single channel, multi-channel, SISO, MIMO, and beamforming communications at mm-wave frequencies. The radio can be considered multiple transceivers, such as the multiple radios illustrated in FIG. 1. In one embodiment, the radio includes a zero intermediate frequency (ZIF) transceiver (e.g., 5 GHz radio 102), a mm-wave transceiver (e.g., mm-wave radio 106), and the frequency-spectrum conversion circuitry 104 coupled between the ZIF transceiver and mm-wave transceiver. The frequency-spectrum converter circuitry 104 to receive WLAN signal in a WLAN frequency spectrum from the ZIF transceiver. The frequency-spectrum converter circuitry 104 converts the WLAN signal to an intermediate frequency (IF) signal and outputs the IF signal. The mm-wave transceiver receives the IF signal and outputs a mm-wave signal based on the IF signal. The mm-wave signal, when applied to a phased-array antenna, causes the phased-array antenna 108 to radiate electromagnetic energy in a mm-wave frequency spectrum. The IF signal has a frequency that is greater than frequencies in the WLAN frequency spectrum and less than frequencies in the mm-wave frequency spectrum. In one embodiment, the frequency-spectrum converter circuitry 104 includes a local oscillator (LO) circuit configured to generate a LO signal, a mixer coupled to the LO circuit, an IF bandpass filter coupled to a first port of the mixer, a RF bandpass filter coupled to a second port of the mixer, the mixer to up-convert a TX signal on the first port or down-covert a RX signal on the second port based on the LO signal; and a controller coupled to the ZIF transceiver, the LO circuit, and the mm-wave transceiver. The controller controls the ZIF transceiver, LO circuit, and the mm-wave transceiver to operate in one of the multiple modes described herein, such as a single-channel operational mode and at least one of a multi-channel operational mode, a SISO operational mode, or a MIMO operational mode to communicate data via the phased-array antenna 108 at mm-wave frequencies in the mm-wave frequency spectrum.

In a further embodiment, the mm-wave transceiver includes multiple RF chains, each having components coupled between an input port and an output port. The components are configured to phase shift, filter, and amplify an RF signal. The frequency-spectrum converter circuitry 104 also includes an N-way divider/combiner coupled between the RF bandpass filter and the input ports of the multiple RF chains.

In a further embodiment, the ZIF transceiver includes multiple channels that are selectable according to a channel assignment scheme. A channel is a frequency range with a center frequency and a certain amount of frequency above and below the center frequency, referred to as a channel bandwidth. For example, a channel may have a channel bandwidth, e.g., 20 MHz, 40 MHz, 80 MHz, and 160 MHz. Multiple channel filters can be configured and/or reconfigured to support one of multiple channel bandwidth schemes. For example, when a channel is selected with a channel bandwidth of 40 MHz, a channel filter of 40 MHz can be used to filter according to the selected channel bandwidth. In one embodiment, in a first period, a first channel of the multiple available channels is selected and a first channel filter of the multiple channel filters is reconfigured to a first multi-channel bandwidth scheme of the multiple different multi-channel bandwidth schemes to filter the first channel according to a first channel bandwidth. In a second period, a second channel of multiple channels is selected and a second channel filter of the multiple channel filters is reconfigured to the first multi-channel bandwidth scheme to filter the second channel according to the first channel bandwidth.

In one embodiment, the wireless communication device 100 includes at least one WLAN transceiver, at least one mm-wave transceiver, and frequency-spectrum conversion circuitry 104 coupled between the at least one WLAN transceiver and the at least one mm-wave transceiver. The wireless communication device 100 may provide a single channel or may provide multiple channels. When providing multiple channels, multiple WLAN transceivers may be used and multiple mm-wave radios may be used.

FIG. 2 is a block diagram of a wireless communication subsystem of an electronic device 200 according to one embodiment. In one embodiment, the wireless communication subsystem 224 has similar or the same components as those described above with respect to the wireless communication device 100 of FIG. 1 and includes one or more WLAN radios, one or more frequency-spectrum conversion circuitry, and one or more mm-wave radios. The multi-element antennas 222 may be one or more phased-array antennas.

The wireless communication device 200 includes a system on chip (SoC) 202 to process data signals in connection with communicating with other wireless communication devices and client consumption devices. The SoC 202 includes a processing element (e.g., a processor core, a central processing unit, or multiple cores) that processes the data signals and controls the radios to communicate with other devices. In one embodiment, the SoC 202 is a dual core SoC, such as the ARM A15 1.5 GHz with hardware network acceleration. The SoC 202 may include memory and storage, such as 2 GB DDR RAM and 64 GB eMMC coupled to the SoC 202 via external HDD interfaces (e.g., SATA, USB3, or the like). The SoC 202 may optionally include multiple RF interfaces, such as a first interface to the first RF module 204 (e.g., HSCI interface for cellular module (3G)), a second interface to the WLAN 2.4 GHz radio 206, a third interface to the WLAN 2.4 GHz radio 208, and one or more RF interfaces to the WLAN 5 GHz radios, such as on a PCIe bus, in the wireless communication subsystem 224. In one embodiment, the SoC 202 is the IPQ8064 Qualcomm SoC or the IPQ4029 Qualcomm SoC. Alternatively, other types of SoCs may be used, such as the Annapurna SoC, or the like. Alternatively, the wireless communication device 200 may include an application processor that is not necessarily considered to be a SoC.

The wireless communication device 200 may also include memory and storage. For example, the wireless communication device 200 may include SSD 64 GB 228, 8 GB Flash 230, and 2 GB 232. The memory and storage may be coupled to the SoC 202 via one or more interfaces, such as USB 3.0, SATA, or SD interfaces. The wireless communication device 200 may also include a single Ethernet port 244 that is an ingress port for Internet Protocol (IP) connection. The Ethernet port 244 is connected to the Ethernet PHY 242, which is connected to the SoC 202. The Ethernet port 244 can be used to service the wireless communication device 200. The wireless communication device 200 may also include one or more debug ports 246, which are coupled to the SoC 202. The memory and storage may be used to cache content, as well as store software, firmware or other data for the wireless communication device 200.

The wireless communication device 200 may also include a power management and charging system 234. The power management and charging system 234 can be connected to a power supply 236 (e.g., 240V outlet, 120V outlet, or the like). The power management and charging system 234 can also connect to a battery 238. The battery 238 can provide power in the event of power loss. The power management and charging system 234 can be configured to send a SoS message on power outage and backup system state. For example, the WLAN radios can be powered down, but the cellular radio can be powered by the battery 238 to send the SoS message. The battery 238 can provide limited operations by the wireless communication device 200, such as for 10 minutes before the entire system is completely powered down. In some cases, power outage will likely affect a geographic area in which the wireless communication device 200 is deployed (e.g., power outage that is a neighborhood wide phenomenon). The power management and charging system 234 may provide a 15V power supply up to 21 watts to the SoC 202. Alternatively, the wireless communication device 200 may include more or less components to operate the multiple antennas as described herein.

The wireless communication device 200 includes a first radio frequency (RF) module 204 coupled between the SoC 202 and a cellular antenna 218. The first RF module 204 supports cellular connectivity using the cellular antenna 218. In one embodiment, the cellular antenna 218 includes a primary wide area network (WAN) antenna element and a secondary WAN antenna element. The first RF module 204 may include a modem to cause the primary WAN antenna, the secondary WAN antenna, or both to radiate electromagnetic energy in the 900 MHz band and 1800 MHz band for the 2G specification, radiate electromagnetic energy in the B1 band and the B8 band for the 3G specification, and radiate electromagnetic energy for the B40 band. The modem may support Cat3 band, 40 TD-LTE, UMTS: Band 1, Band 8, and GSM: 900/1800. The modem may or may not support CDMA. The cellular modem may be used for diagnostics, network management, down time media caching, meta-data download, or the like. Alternatively, the first RF module 204 may support other bands, as well as other cellular technologies. The wireless communication device 200 may include a GPS antenna and corresponding GPS module to track the location of the wireless communication device 200.

The wireless communication device 200 may include a first set of wireless local area network (WLAN) modules 206, 208 coupled between the SoC 202 and dual-band omnidirectional antennas 220. A first WLAN module 206 may support WLAN connectivity in a first frequency range using one of the dual-band omnidirectional antennas 220. A second WLAN module 208 may support WLAN connectivity in a second frequency range using one of the dual-band omnidirectional antennas 220. The dual-band omnidirectional antennas 220 may be two omnidirectional antennas for 2.4 GHz. The multi-element antenna(s) 222 can be set up in various configurations and can be operated as phased-array antennas. The multi-element antenna(s) 222 can be controlled by micro controller 226, as described herein.

The wireless communication device 200 includes a set of WLAN modules (not individually illustrated in FIG. 2) and a third set of mm-wave modules coupled between the SoC 202 and multi-element antennas 222. The second set of WLAN modules 210-216 supports WLAN functionality in the WLAN domain, but in connection with the mm-wave modules, provide connectivity to other devices in the mm-wave frequency range using a set of multiple elements of a multi-element antenna 222. The second set of WLAN modules and the third set of mm-wave modules are operable to communicate with the other wireless communication devices. The wireless communication subsystem 224 is coupled to a micro controller 226. The micro controller 226 controls the wireless communication subsystem 224 to select different channels, different channel bandwidths (via the different channel filters), and controls the beamforming operations of the multi-element antenna 222 for wireless communications between the wireless communication device 200 and the other wireless communication devices, client consumption devices, or both. The wireless communication subsystem 224 is described in more detail below with respect to FIGS. 3-8.

In the depicted embodiment, the first set of WLAN modules include a first a first 2×2 2.4 GHz MIMO radio and a 2×2 5 GHz MIMO radio. The second set of WLAN modules includes a first 2×2 5 GHz MIMO radio, a second 2×2 5 GHz MIMO radio, a third 2×2 5 GHz MIMO radio, and a fourth 2×2 5 GHz MIMO radio. Alternatively, other numbers of 5 GHz MIMO radios may be used, as described below with respect to FIGS. 3-8. The dual-band omnidirectional antennas 220 may include a first omnidirectional antenna and a second omnidirectional antenna (not individually illustrated in FIG. 2). The multi-element antenna 222 a phased-array antenna for each channel of the wireless communication subsystem 224 as described herein.

The micro controller 226 can be used to program the wireless communication subsystem 424, including the frequency-spectrum conversion circuitry as described herein.

It should be noted that any of the radios in the wireless communication device 200 in FIG. 2 may be any of the radios as described below with respect to FIGS. 3-8.

Figure 3:
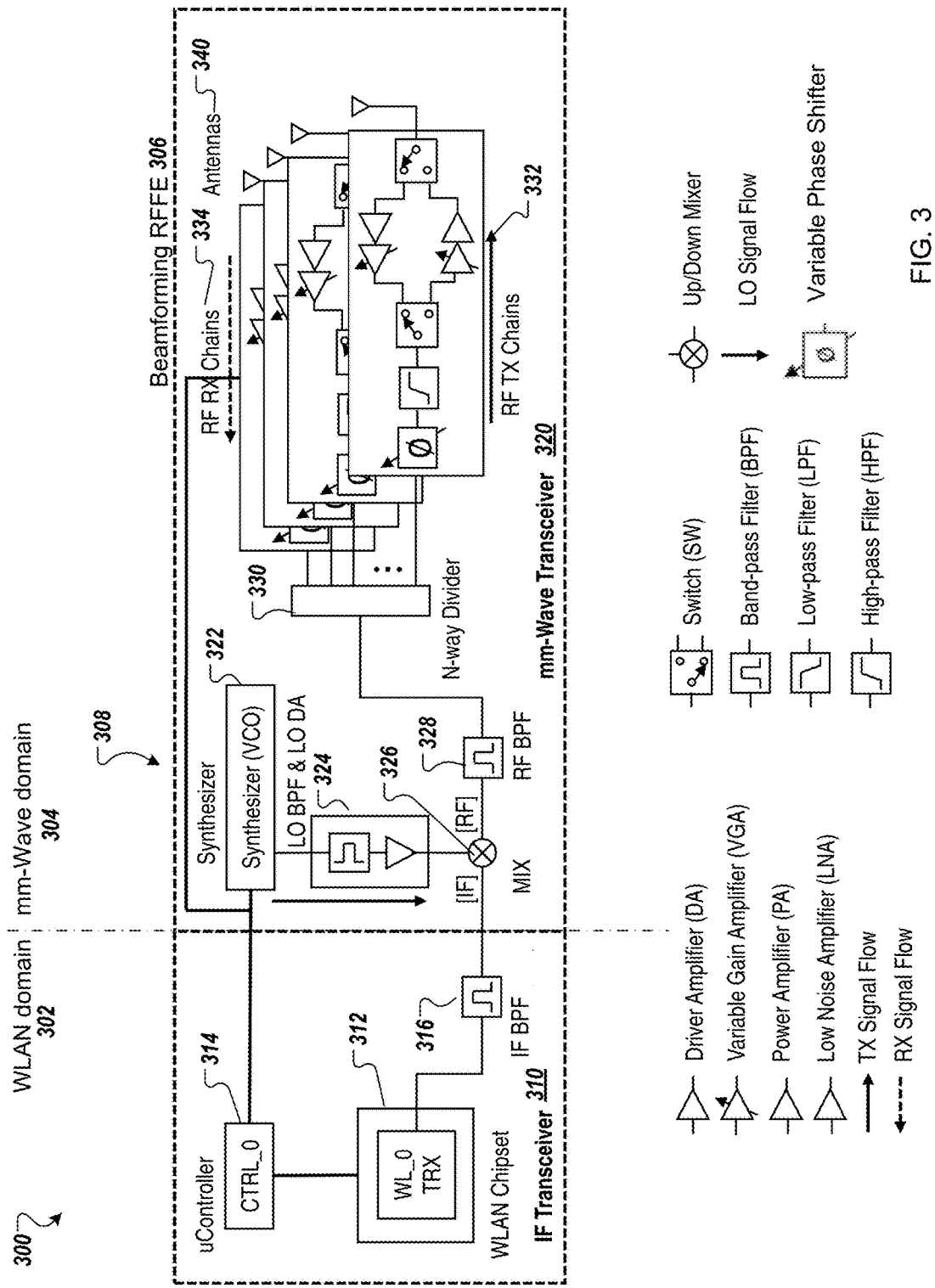
FIG. 3 is a block diagram illustrating a radio configured for single channel, time division duplex (TDD) communications at millimeter wave (mm-wave) frequencies according to one embodiment.

FIG. 3 is a block diagram illustrating a radio 300 configured for single channel, TDD communications at millimeter wave (mm-wave) frequencies according to one embodiment. The radio 300 has a WLAN domain 302 and an mm-wave domain 304. In the WLAN domain 302, the radio 300 includes an intermediate frequency (IF) transceiver 310, including a WLAN transceiver 312, a controller 314, and an IF band pass filter (BPF) 316. The controller 314 may be a micro controller and may be the same micro controller 426 in FIG. 4 that is also used for antenna switching. Alternatively, the controller 314 may be a separate controller than the micro controller 226. In one embodiment, the controller 314 is configured to control the WLAN transceiver 312 and the mm-wave transceiver 320 to operate in one of multiple operational modes of the radio 300. The multiple operational modes may include any one or more of a single-channel operational mode, a multi-channel operational mode, a SISO operational mode, or a MIMO operational mode to communicate data via a beamforming-type antenna (e.g., a phased-array antenna) at mm-wave frequencies in the mm-wave frequency spectrum. The controller 314 can also be used to control the beamforming RFFE 306 to control the beamforming operations by the radio 300. The WLAN transceiver 312 may include multiple channels that are selectable according to a channel assignment scheme. The WLAN transceiver 312 may also include multiple channel filters for each of the different channels. These different channel filters are reconfigurable to support different multi-channel bandwidth schemes, such as described in more detail below. For example, the different channel filters can different filter bandwidths for various channel bandwidths, such as, for examples, 20 MHz, 40 MHz, 80 MHz, and 160 MHz.

Referring back to FIG. 3, the controller 314 controls the WLAN transceiver 312 and the WLAN transceiver 312 outputs a TX signal that passes through the IF BPF 316. The controller 314 may include hardware, firmware, software, or any combination thereof that can be used to generate control signals that facilitate the conversion of the WLAN signals produced by the IF transceiver 310 to the mm-wave signals for the mm-wave transceiver 320 and that facilitate the conversion of the mm-wave signals produced by the mm-wave transceiver 320 to the WLAN signals for the IF transceiver 310. For example, the controller 314 can generate control signals for beamforming and beam tracking operations. The signaling for beamforming and beam tracking portions of the IEEE 802.11ac and 802.11ad protocols are different. The controller 314 can be configured to convert the signaling between the two protocols. The IF BPF 316 filters the TX signal to obtain a filtered TX signal. The mm-wave domain 304 includes a mm-wave transceiver 320, including a local oscillator (LO) circuit 322, a LO BPF and LO driver amplifier (DA) 324, a mixer 326, a RF BPF 328, a N-way divider/combiner 330, multiple TX chains 332 configured to be coupled to multiple antenna elements 340 of a multi-element antenna (e.g., a phased-array antenna or other beamforming-type antennas), and multiple RX chains 334 configured to be coupled to the multiple antenna elements 340. Each of the multiple RF chains includes a path of components coupled between an input port and an output port, the path of components to phase shift, filter, and amplify an RF signal.

The LO circuit 322 may be a voltage controlled oscillator (VCO), a phase locked loop (PLL) synthesizer, or other types of frequency synthesizers or oscillators. The LO circuit 322 can be a synthesizer (VCO) as illustrated in the depicted embodiment. Alternatively, other LO circuits may be used. The N-way divider/combiner 330 and multiple TX chains 332 and multiple RX chains 334 may be considered part of beamforming radio frequency front-end (RFFE) circuitry 306. The N-way divider/combiner 330 splits a RF signals in N-paths, where N is the number of the multiple RF TX chains 323 in the mm-wave transceiver 320. For example, N may be 108, 16, 32, or other numbers of ways depending on the number of supported RF chains in the mm-wave transceiver 320.

In the depicted embodiment, each of the multiple TX chains 332 includes a variable phase shifter, a filter, a variable gain amplifier (VGA), and a power amplifier (PA). Similarly, each of the multiple RX chains 334 includes a variable phase shifter, a filter, a VGA, and a low noise amplifier (LNA). The multiple TX chains 332 and the multiple RX chains 334 may share common circuitry using a switch before and a switch after a pair of the VGA and PA in the respective one of the multiple TX chains 332 and a pair of the VGA and LNA in the respective one of the multiple RX chains 334.

The mixer 326 (also referred to as a frequency mixer, an up/down mixer) can be an electrical circuit that creates a new signal from two input signals. Mixers can be used to shift signals from one frequency range to another. In this embodiment, the mixer 326 down converts the TX signals, but as described below, can up convert RX signals. In the depicted embodiment, the mixer 326 produces a down-converted TX signal for beamforming by the beamforming RFFE 306. The RF signal output by the mixer 326 has a higher frequency than the TX signal output by the IF transceiver 310 (also referred to as the IF signal input into the mixer 326).

In one embodiment, the controller 314, LO circuit 322, LO BPF and LO DA 324, the mixer 326, the IF BPF 316, and RF BPF 328 can be considered part of a frequency-spectrum converter circuitry 308 (also referred to as conversion circuitry, frequency-spectrum converter, or frequency-spectrum conversion circuitry). The frequency-spectrum converter circuitry 308 may include more or less components than those depicted. The frequency-spectrum converter circuitry 308 is coupled to an output of the IF transceiver 320 and an input of the mm-wave transceiver 320. The frequency-spectrum converter circuitry 308 is configured to convert first TX RF signals in a first frequency range (e.g., WLAN frequency range) to second TX RF signals in a mm-wave frequency spectrum (e.g., 30 GHz to 300 GHz approximately) on a TX path between the IF transceiver 320 and the mm-wave transceiver 320. The conversion circuit 408 is also configured to convert first RX RF signals in the mm-wave frequency spectrum to second RX RF signals in the first frequency range on a RX path between the IF transceiver 310 and the mm-wave transceiver 320. The frequency-spectrum converter circuitry 308 may be further configured to convert the first TX RF signals to first IF signals in an IF frequency range on the TX path and divide the IF signals N-ways to obtain the second TX RF signals in the mm-wave frequency range on the TX path, where N is a number of RF TX chains in the mm-wave transceiver 320, each of the RF chains phase shift, filter, and amplify the second TX RF signals terminated at one of multiple antenna elements of the multi-element antenna. The frequency-spectrum converter circuitry 308 may be further configured to combine the first RX RF signals received at the multiple antenna elements 340 as combined RF signals in the mm-wave frequency range and convert the combined RF signals to second IF signals in the IF frequency range on the RX path.

The following describes operations of the radio 300 when configured for single-channel, TDD communications when the radio 300 is transmitting data and the frequency-spectrum converter circuitry 308 converts WLAN signals to mm-wave signals. The IF transceiver 310 may be a zero-IF (ZIF) transceiver that transmits a WLAN signal that complies with the IEEE 802.11ac standard (also referred to as 802.11ac Wi-Fi® technology). The WLAN signal may be Channel 36 in 5 GHz frequency band specified for the Wi-Fi® technology) with a center frequency of 5.18 GHz. The frequency-spectrum converter circuitry 308 receives the WLAN signal. The frequency-spectrum converter circuitry 308 includes the IF BPF 316 that is centered at a channel center frequency and filters the WLAN signal to obtain a filtered IF signal. The frequency-spectrum converter circuitry 308 also includes the mixer 326 that converts the filtered IF signal to obtain the second TX RF signals. The second TX RF signals are mm-wave RF signals. The frequency-spectrum converter circuitry 308 includes the RF BPF 328 that filters the mm-wave RF signals to remove harmonics of the mm-wave RF signal, other out of band mixing spurs, or both. The frequency-spectrum converter circuitry 308 includes the LO circuit 322 that generates the LO signal. The LO BPF and LO DA 324 filters the LO signal to obtain a filtered LO signal that drives a LO port of the mixer 326. The N-way divider/combiner 330 (which now operates as a divider) splits the second TX RF Signals (mm-wave RF signals) into the N TX paths. Each of the multiple RF TX chains 323 phase shifts, filters, and amplifies a respective one the second TX RF signals terminated at one of multiple antenna elements 340 of a multi-element antenna. The IF signals may be 5 GHz signals in the frequency band used by the Wi-Fi® technology.

In another embodiment, the frequency-spectrum converter circuitry 308 is further configured to convert a first TX RF signals, generated by a first transceiver, to first IF signals in an IF frequency range on the TX path and divide the IF signals N-ways to obtain second TX RF signals in a mm-wave frequency range on the TX path, where N is a number of RF chains in a second transceiver, each of the RF chains phase shift, filter, and amplify the second TX RF signals terminated at one of multiple antenna elements of the multi-element antenna. In one embodiment, the IF frequency range (also referred to herein as first frequency range) is approximately 2.4 GHz to approximately 2.5 GHz, such as used in the Wi-Fi® technology in 2.4 GHz frequency band. The mm-wave frequency range (also referred to herein as second frequency range) is approximately 30 GHz to approximately 300 GHz. In another embodiment, the IF frequency range is approximately 5.7 GHz to approximately 5.8 GHz, such as used in the Wi-Fi® technology in 5 GHz frequency band, and the mm-wave frequency range is approximately 30 GHz to approximately 300 GHz. The mm-wave frequency range may be any one of the following frequency bands: the 28 GHz band, the 37/42 GHz band (e.g., 37/42 GHz Bands (37.0-38.6 GHz and 42.0-42.5 GHz), the 60 GHz band (e.g., 57-64 GHz and 64-71 GHz or 57-64 GHz band), or the 70/80 GHz band (e.g., 71-76 GHz and 81-86 GHz or 71-86 GHz). It should be noted that ISM bands (referred to Industrial, Scientific, and Medical bands) are part of the radio spectrum that can be used for any purpose without a license in most countries. For example, in the U.S., the ISM band may include 902-928 MHz band, 2.4 GHz bands, and 5 GHz (5.7-5.8 GHz) bands can be used for machines that emitted radio frequencies. The IF transceiver 310 can operate in any of the following ISM frequency ranges: 902-928 MHz; 2.4-2.4835 GHz, 5.725-5.825 GHz (IEEE 802.11a/n/ac); 5.15-5.25 GHz, 5.25-5.35 GHz, 5.47-5.725 GHz, or 5.725-5.825 GHz for IEEE 802.11a/n. ISM bands may also include the 60 GHz band (e.g., 57-64 GHz for WirelessHD and WiGig). Extremely high frequency (EHF) is the International Telecommunications Union (ITU) designation for the band of radio frequencies in the electromagnetic spectrum from 30 to 300 GHz. In EHF bands, radio waves have wavelengths form ten to one millimeter, giving it the name millimeter-wave band. In other embodiments, the mm-wave transceiver can operate in the EHFs between the super high frequency band (3 GHz to 30 GHz) (centimeter-wave band) and the far infrared band (300 GHz to 20 THz).

The following describes operations of the radio 300 when configured for single-channel, TDD communications when the radio 300 is receiving data and the frequency-spectrum converter circuitry 308 converts mm-wave signals to WLAN signals. An over-the-air signal (hereinafter RX signal) is transduced by each of the multiple antenna elements 340 and passed to each of the multiple RF RX chains 334. Within each of the multiple RF RX chains 334, the RX signal undergoes low noise amplification by the LNA, amplitude adjustment by the VGA, and high-pass filtering by the variable phase shifter. All signals are combined by the N-way divider/combiner 330 (which now operates as a combiner) as a combined RF signal. The RF BPF 328 filters the combined RF signal to attenuate noise and interferences above the band of interest to obtain a filtered RF signal. The mixer 326 down-coverts the filtered RF signal to IF (e.g., 5.18 GHz) to obtain a down-converted signal. The LO, DA and filter stages are used to feed the LO signal to the mixer 326 as described above. The IF BPF 316 filters the down-converted signal to attenuate noise and interference outside the channel of interest to obtain an IF RX signal. The IF RX signal is passed to a RX port of the WLAN transceiver 312. In one embodiment, the WLAN transceiver 312 is a Z-IF transceiver that receives WLAN signal that comply with the IEEE 802.11ac standard (also referred to as 802.11ac Wi-Fi® technology). The WLAN signal may be Channel 36 in 5 GHz frequency band specified for the Wi-Fi® technology) with a center frequency of 5.18 GHz.

Figure 4:
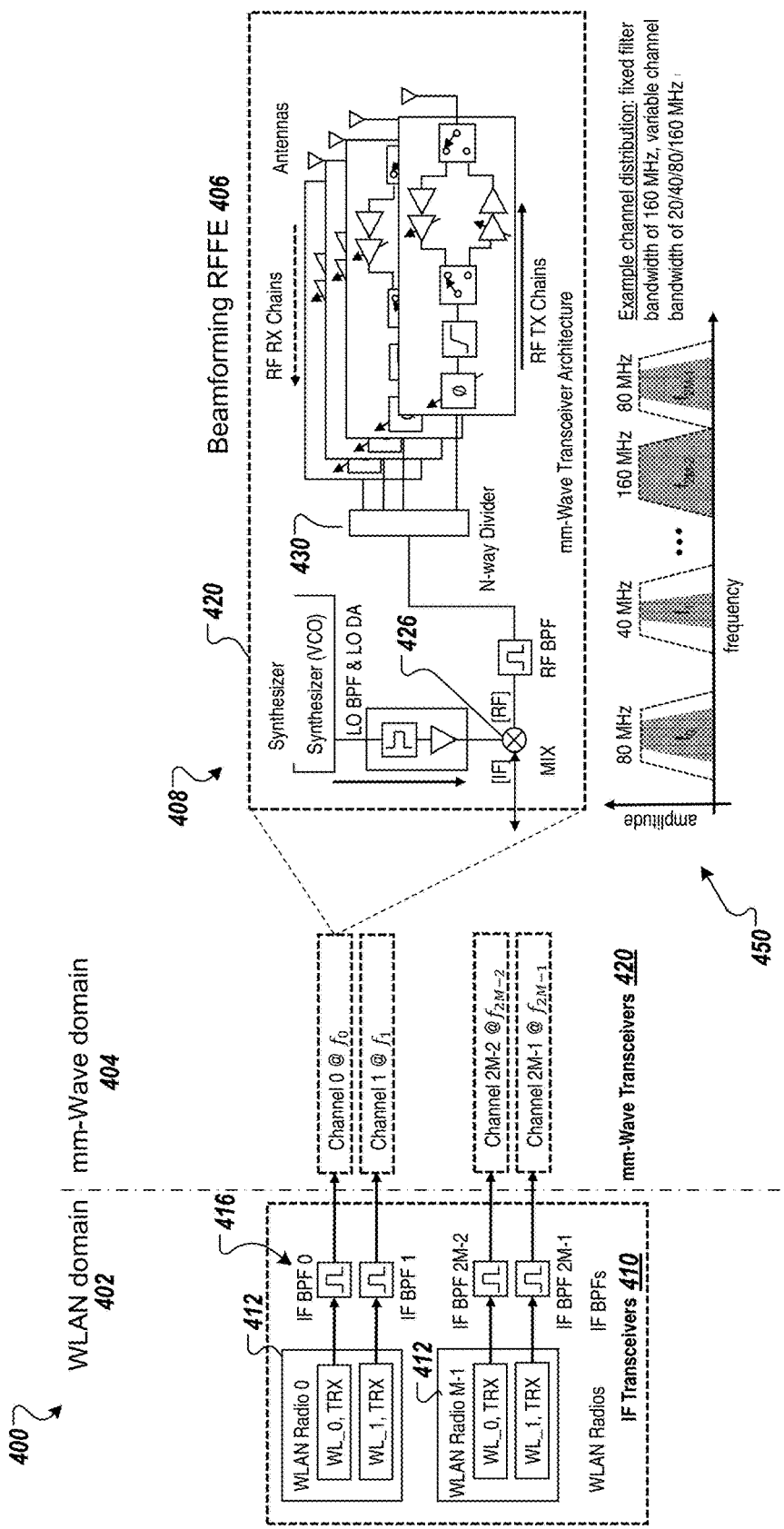
FIG. 4 is a block diagram illustrating of a radio configured for multi-channel, single-input-single-output (SISO), TDD communications at mm-wave frequencies according to one embodiment.

FIG. 4 is a block diagram illustrating of a radio 400 configured for multi-channel, SISO, TDD communications at mm-wave frequencies according to one embodiment. The radio 400 has a WLAN domain 402 and an mm-wave domain 404. In the WLAN domain 402, the radio 400 includes M number of WLAN radios 412 as the IF transceivers 410 that transmit and receive WLAN signals on 2M RF channels, where M is a positive integer. Each WLAN radio 412 includes two ZIF transceivers (chain 0 and chain 1) communicating on two different RF channels.

In a TX mode, the IF from each IF transceiver is passed to an IF band-pass filter 416 with a fixed filter bandwidth (e.g., 160 MHz) and centered at a unique frequency $(f_0, f_1, \ldots, f_{M-1})$ The filtered IF signals are passed to an array of 2M mm-wave transceivers 420. In FIG. 4, only one of the mm-wave transceivers 420 is illustrated for ease of description and illustration. Each of the mm-wave transceivers 420 includes conversion circuitry 408, which is similar to frequency-spectrum converter circuitry 308, and beamforming RFFE 406, which is similar to the beamforming RFFE 306.

Within each mm-wave transceiver 420, the signal is up-converted by the mixer 426 from IF to mm-Wave RF and the up-converted signals are distributed by the N-way divider/combiner 430 to each of multiple RF TX chains where each signal undergoes phase shifting, filtering, and amplifying. Each signal is terminated at one of the antenna elements of the multi-element antenna, such as described above with respect to FIG. 5.

In a RX mode, each antenna element transduces the RF signal and passes it to the respective one of the multiple RF RX chains where each signal is amplified, filtered and phase shifted. The RF output of each of the multiple RF RX chains is combined by the N-way divider/combiner 430 and passed to the mixer 426 to down-convert the signal. Each down-converted IF signal is filtered by the respective one of the IF band-pass filters 416 and routed to an IF chain on one of the WLAN radios 412.

As illustrated in FIG. 4, an example frequency distribution 450 illustrates filter profiles (dashed lines) containing channels of different bandwidths (shaded regions within the dashed lines). The center frequencies can be distributed with a minimum spacing to ensure that the channels do not interfere. In one implementation, a fixed filter bandwidth of 160 MHz can be used with variable channel bandwidth of 20/40/80/160 MHz.

Figure 5:
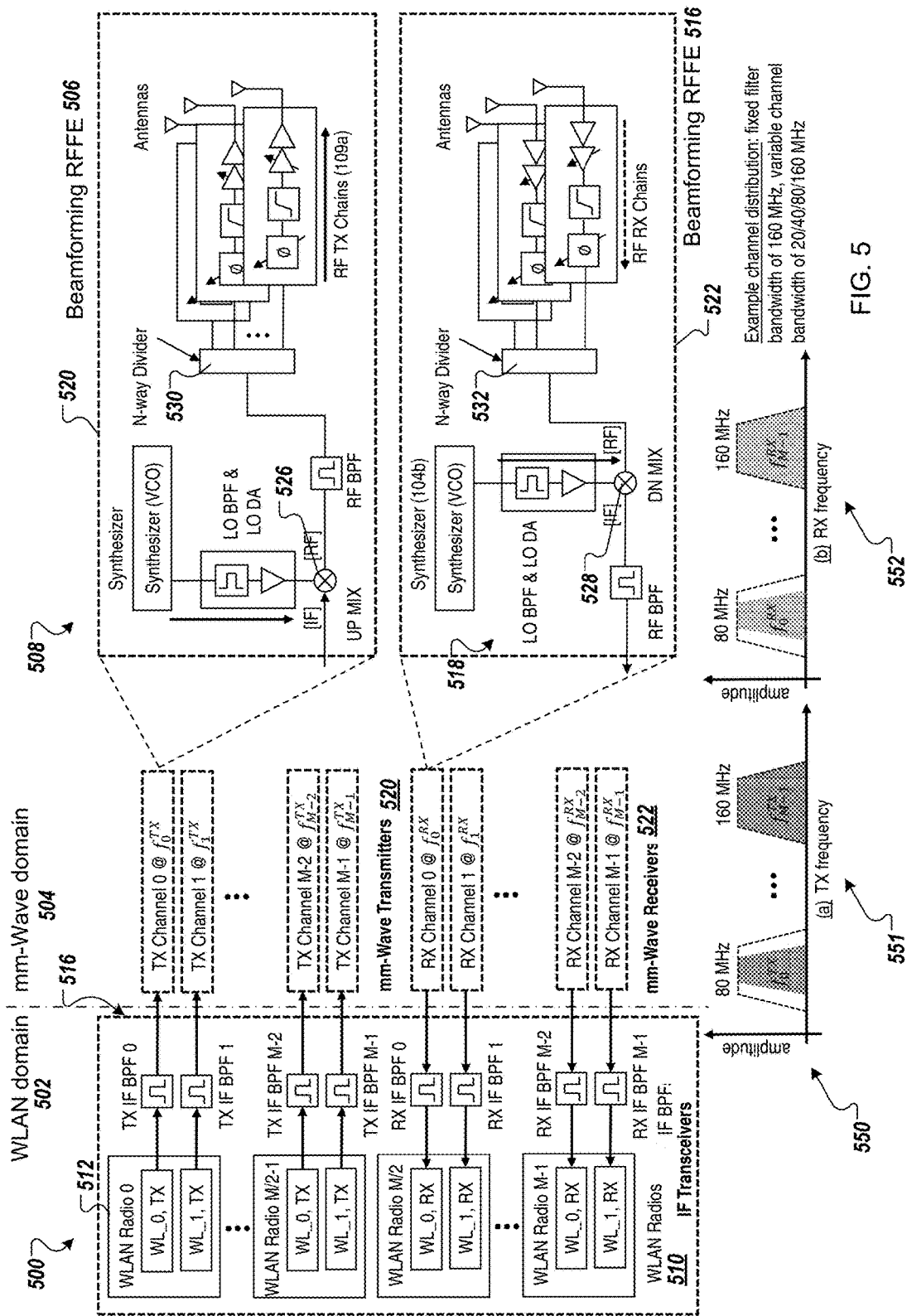
FIG. 5 is a block diagram illustrating of a radio configured for multi-channel, SISO, frequency division duplex (FDD) communications at mm-wave frequencies according to one embodiment.

FIG. 5 is a block diagram illustrating of a radio 500 configured for multi-channel, SISO, FDD communications at mm-wave frequencies according to one embodiment. The radio 500 has a WLAN domain 502 and an mm-wave domain 504. In the WLAN domain 502, the radio 500 includes M number of WLAN radios 512 as the IF transceivers 510 of which M/2 of the WLAN radios 512 operate in transmit mode and M/2 of the WLAN radios 512, where M is a positive integer. The first set of WLAN radios 512 transmit WLAN signals (e.g., according to the IEEE 802.11ac standard) and the second set of WLAN radios 512 receive WLAN signals. Each WLAN radio 512 includes two ZIF transceivers (chain 0 and chain 1) communicating on two different RF channels. Compared to the TDD case in FIG. 4, the same number of radios may be used, but only M RF channels are utilized.

In a TX mode, the IF from each IF transceiver in the first set of WLAN radios 512 is passed to an IF band-pass filter 516 with a fixed filter bandwidth (e.g., 160 MHz) and centered at a unique frequency $(f_0, f_1, \ldots, f_{M-1})$. The filtered IF signals are passed to an array of M/2 mm-wave transmitters 520. In FIG. 5, only one of the mm-wave transmitters 520 is illustrated for ease of description and illustration. Each of the mm-wave transmitters 520 includes conversion circuitry 508, which is similar to frequency-spectrum converter circuitry 508, and beamforming RFFE 506, which is similar to the beamforming RFFE 506.

Within each mm-wave transmitter 520, the signal is up-converted by the mixer 526 from IF to mm-Wave RF and the up-converted signals are distributed by the N-way divider/combiner 530 to each of multiple RF TX chains where each signal undergoes phase shifting, filtering, and amplifying. Each signal is terminated at one of the antenna elements of the multi-element antenna, such as described above with respect to FIG. 5.

In a RX mode, each antenna element transduces the RF signal and passes it to the respective one of multiple RF RX chains where each signal is amplified, filtered, and phase shifted. The multiple RF RX chains illustrated in FIG. 5 are part of one mm-wave receiver mm-wave receiver of an array of M/2 of mm-wave receivers 522. In FIG. 5, only one of the mm-wave receivers 522 is illustrated for ease of description and illustration. Each of the mm-wave receivers 522 includes conversion circuitry 518, which is similar to frequency-spectrum converter circuitry 308, and beamforming RFFE 516, which is similar to the beamforming RFFE 506. The RF output of each of the multiple RF RX chains is combined by the N-way divider/combiner 532 and passed to the mixer 528 to down-convert the signal. Each down-converted IF signal is filtered by the respective one of the IF band-pass filters 516 and routed to an IF chain on one of the WLAN radios 512.

As illustrated in FIG. 5, an example frequency distribution 550 illustrates filter profiles (dashed lines) containing channels of different bandwidths (shaded regions within the dashed lines) for TX frequencies 551 and for RX frequencies 552. The center frequencies can be distributed with a minimum spacing to ensure that the channels do not interfere. In one implementation, a fixed filter bandwidth of 160 MHz can be used with variable channel bandwidth of 20/40/80/160 MHz.

Figure 6:
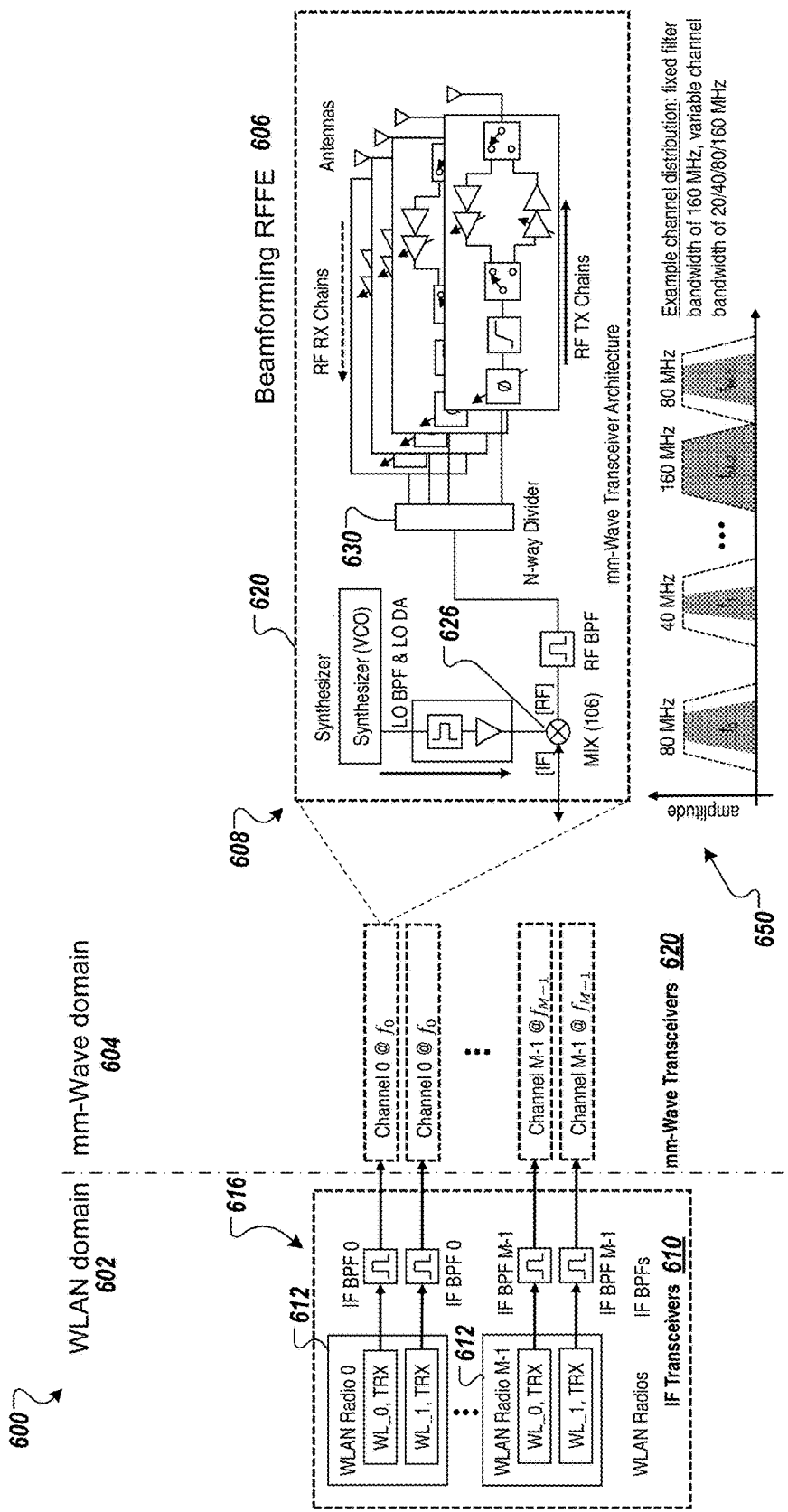
FIG. 6 is a block diagram illustrating of a radio configured for multi-channel, multiple-input-multiple-output (MIMO), TDD communications at mm-wave frequencies according to one embodiment.

FIG. 6 is a block diagram illustrating of a radio 600 configured for multi-channel, MIMO, TDD communications at mm-wave frequencies according to one embodiment. The radio 600 has a WLAN domain 602 and an mm-wave domain 604. In the WLAN domain 602, the radio 600 includes M number of WLAN radios 612 as the IF transceivers 610 that transmit and receive WLAN signals on M RF channels, where M is a positive integer. Each WLAN radio 612 includes two ZIF transceivers (chain 0 and chain 1) communicating on the same RF channel.

In a TX mode, the IF from each IF transceiver is passed to an IF band-pass filter 616 with a fixed filter bandwidth (e.g., 160 MHz) and centered at a unique frequency $(f_0, f_1, \ldots, f_{M-1})$. The filtered IF signals are passed to an array of M mm-wave transceivers 620. In FIG. 6, only one of the mm-wave transceivers 620 is illustrated for ease of description and illustration. Each of the mm-wave transceivers 620 includes conversion circuitry 608, which is similar to frequency-spectrum converter circuitry 308, and beamforming RFFE 606, which is similar to the beamforming RFFE 306.

Within each mm-wave transceiver 620, the signal is up-converted by the mixer 626 from IF to mm-Wave RF and the up-converted signals are distributed by the N-way divider/combiner 630 to each of multiple RF TX chains where each signal undergoes phase shifting, filtering, and amplifying. Each signal is terminated at one of the antenna elements of the multi-element antenna, such as described above with respect to FIG. 5.

In a RX mode, each antenna element transduces the RF signal and passes it to the respective one of the multiple RF RX chains where each signal is amplified, filtered, and phase shifted. The RF output of each of the multiple RF RX chains is combined by the N-way divider/combiner 630 and passed to the mixer 626 to down-convert the signal. Each down-converted IF signal is filtered by the respective one of the IF band-pass filters 616 and routed to an IF chain on one of the WLAN radios 612.

As illustrated in FIG. 6, an example frequency distribution 650 illustrates filter profiles (dashed lines) containing channels of different bandwidths (shaded regions within the dashed lines). The center frequencies can be distributed with a minimum spacing to ensure that the channels do not interfere. In one implementation, a fixed filter bandwidth of 160 MHz can be used with variable channel bandwidth of 20/40/80/160 MHz.

In one embodiment, the radio 600 is used in a MIMO diversity mode. In MIMO diversity mode, identical copies of the signal (information) are transmitted from and received by each of the 2 ZIF transceivers (chain 0 and chain 1) of the WLAN radios 612. This may improve system gain for reliability. In another embodiment, the radio 600 is used in a MIMO spatial-multiplexing mode. In MIMO spatial-multiplexing mode, independent signals containing complementary portions of the baseband information are transmitted from and received by each of the 2 ZIF transceivers (chain 0 and chain 1) of the WLAN radios 612. The information from each of the 2 ZIF transceivers (chain 0 and chain 1) are combined in the digital domain, resulting in an effective data rate that is equal to a sum of data rates in each chain.

Figure 7:
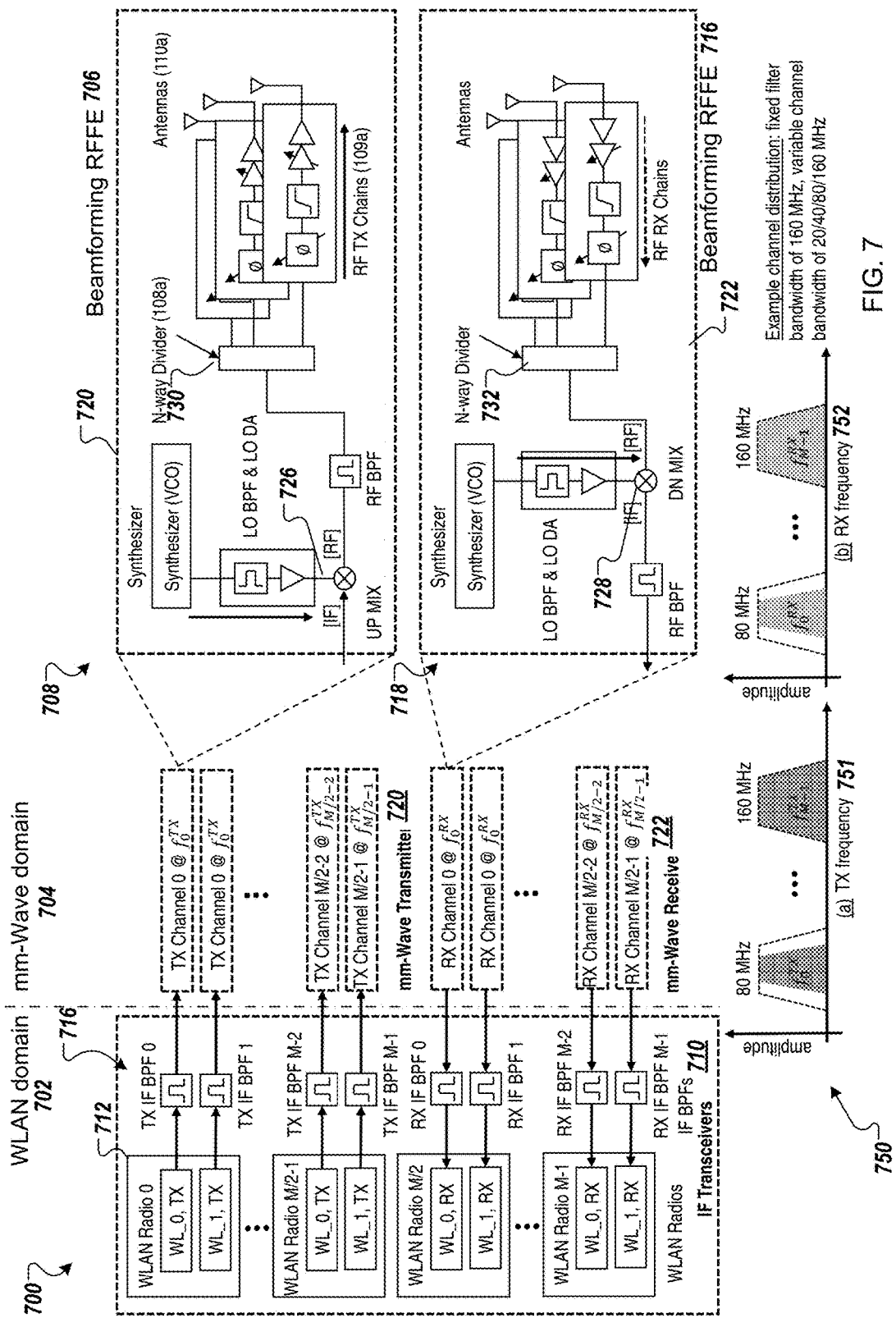
FIG. 7 is a block diagram illustrating of a radio configured for multi-channel, MIMO, FDD communications at mm-wave frequencies according to one embodiment.

FIG. 7 is a block diagram illustrating of a radio 700 configured for multi-channel, MIMO, FDD communications at mm-wave frequencies according to one embodiment. The radio 700 has a WLAN domain 702 and an mm-wave domain 704. In the WLAN domain 702, the radio 700 includes M number of WLAN radios 712 as the IF transceivers 710 of which M/2 of the WLAN radios 712 operate in transmit mode and M/2 of the WLAN radios 712, where M is a positive integer. The first set of WLAN radios 712 transmit WLAN signals (e.g., according to the IEEE 802.11ac standard) and the second set of WLAN radios 712 receive WLAN signals. Each WLAN radio 712 includes two ZIF transceivers (chain 0 and chain 1) communicating on the same RF channel. Compared to the TDD case in FIG. 6, the same number of radios may be used, but only M/2 RF channels are utilized.

In a TX mode, the IF from each IF transceiver in the first set of WLAN radios 712 is passed to an IF band-pass filter 716 with a fixed filter bandwidth (e.g., 160 MHz) and centered at a unique frequency ($t_0, f_1, \ldots, f_{M-1}$). The filtered IF signals are passed to an array of M/2 mm-wave transmitters 720. In FIG. 7, only one of the mm-wave transmitters 720 is illustrated for ease of description and illustration. Each of the mm-wave transmitters 720 includes conversion circuitry 708, which is similar to frequency-spectrum converter circuitry 308, and beamforming RFFE 706, which is similar to the beamforming RFFE 506.

Within each mm-wave transmitter 720, the signal is up-converted by the mixer 726 from IF to mm-Wave RF and the up-converted signals are distributed by the N-way divider/combiner 730 to each of multiple RF TX chains where each signal undergoes phase shifting, filtering, and amplifying. Each signal is terminated at one of the antenna elements of the multi-element antenna, such as described above with respect to FIG. 5.

In a RX mode, each antenna element transduces the RF signal and passes it to the respective one of multiple RF RX chains where each signal is amplified, filtered, and phase shifted. The multiple RF RX chains illustrated in FIG. 7 are part of one mm-wave receiver mm-wave receiver of an array of M/2 of mm-wave receivers 722. In FIG. 7, only one of the mm-wave receivers 722 is illustrated for ease of description and illustration. Each of the mm-wave receivers 722 includes conversion circuitry 718, which is similar to frequency-spectrum converter circuitry 508, and beamforming RFFE 716, which is similar to the beamforming RFFE 306. The RF output of each of the multiple RF RX chains is combined by the N-way divider/combiner 732 and passed to the mixer 728 to down-convert the signal. Each down-converted IF signal is filtered by the respective one of the IF band-pass filters 716 and routed to an IF chain on one of the WLAN radios 712.

As illustrated in FIG. 7, an example frequency distribution 750 illustrates filter profiles (dashed lines) containing channels of different bandwidths (shaded regions within the dashed lines) for TX frequencies 751 and for RX frequencies 752. The center frequencies can be distributed with a minimum spacing to ensure that the channels do not interfere. In one implementation, a fixed filter bandwidth of 160 MHz can be used with variable channel bandwidth of 20/40/80/160 MHz.

In one embodiment, the radio 800 is used in a MIMO diversity mode. In MIMO diversity mode, identical copies of the signal (information) are transmitted from and received by each of the 2 ZIF transceivers (chain 0 and chain 1) of the WLAN radios 812. This may improve system gain for reliability. In another embodiment, the radio 800 is used in a MIMO spatial-multiplexing mode. In MIMO spatial-multiplexing mode, independent signals containing complementary portions of the baseband information are transmitted from and received by each of the 2 ZIF transceivers (chain 0 and chain 1) of the WLAN radios 812. The information from each of the 2 ZIF transceivers (chain 0 and chain 1) are combined in the digital domain, resulting in an effective data rate that is equal to a sum of data rates in each chain.

Figure 8:
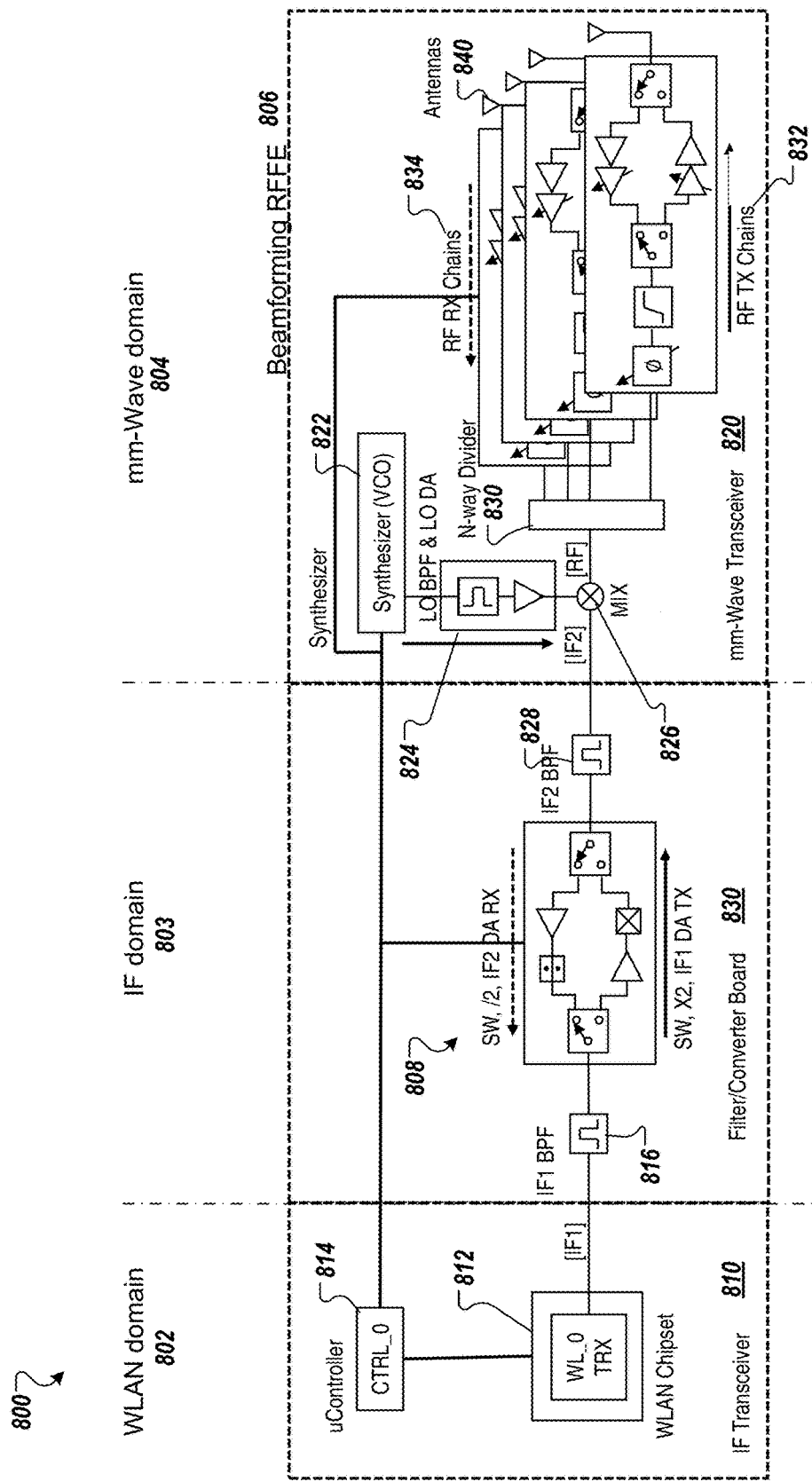
FIG. 8 is a block diagram illustrating a radio with a filter-converter board coupled between an IF transceiver and an mm-wave transceiver according to one embodiment.
Figure 9:
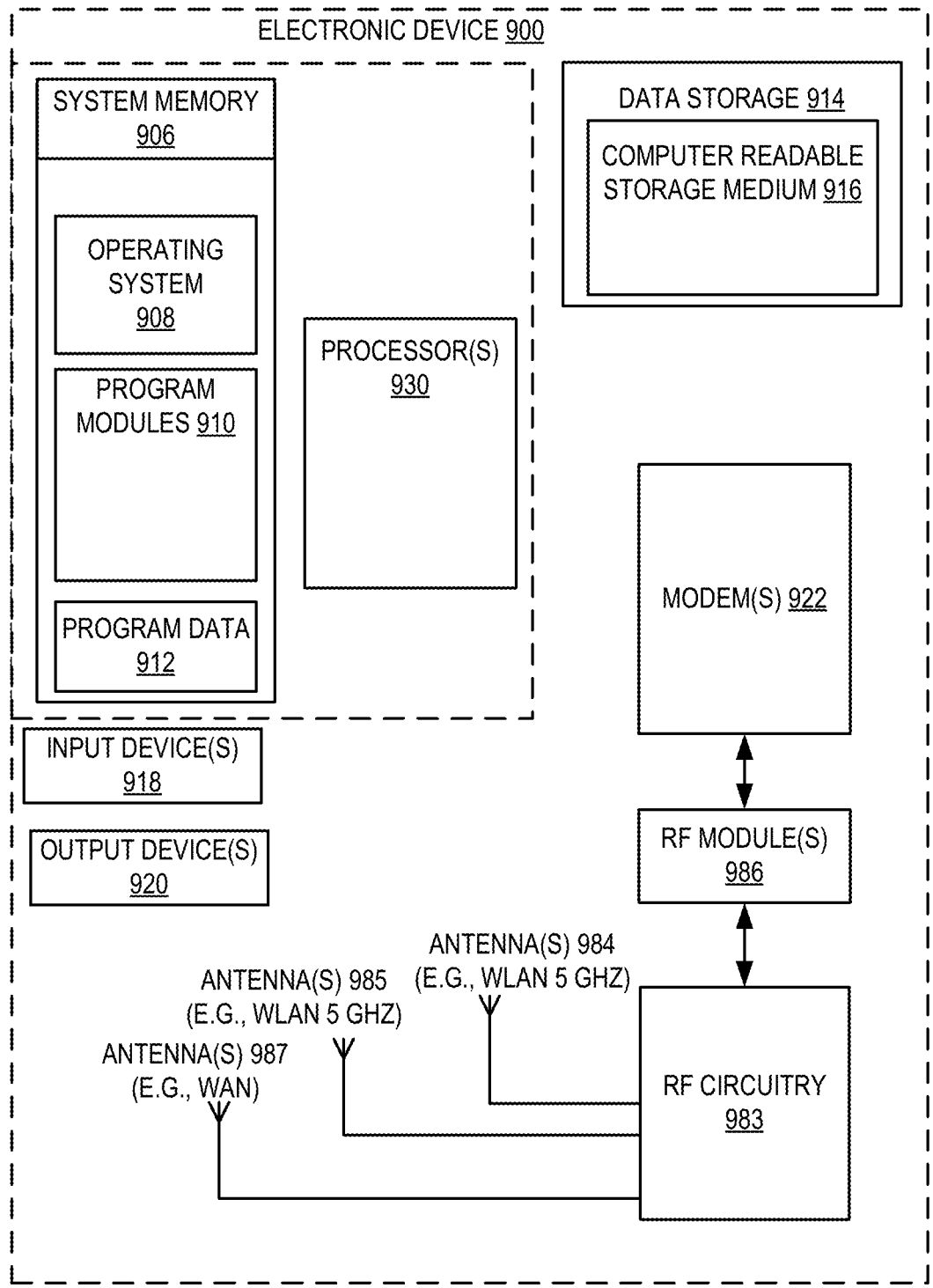
FIG. 9 is a block diagram of an electronic device with a WLAN transceiver, mm-wave transceiver, and frequency-conversion circuitry according to one embodiment.

FIG. 8 is a block diagram illustrating a radio 800 with a filter-converter board 830 coupled between an IF transceiver 810 and an mm-wave transceiver 820 according to one embodiment. The radio 800 has a WLAN domain 802, and IF domain 803, and an mm-wave domain 804.

In the WLAN domain 802, the radio 800 includes an IF transceiver 810, including a WLAN transceiver 812, and a controller 814. The WLAN transceiver 812 may be a ZIF transceiver that transmits a WLAN signal that complies with the IEEE 802.11ac standard (also referred to as 802.11ac Wi-Fi® technology). The WLAN signal may be Channel 36 in 10 GHz frequency band specified for the Wi-Fi® technology) with a center frequency of 10.18 GHz.

In the IF domain 803, the radio 800 includes a first IF BPF 816, a conversion circuit 808, and a second IF BPF 828. The conversion circuit 808 receives the WLAN signal from the IF transceiver 810. The conversion circuit 808 includes the first IF BPF 816 that is centered at a channel center frequency and filters the WLAN signal to obtain a filtered IF signal. The conversion circuit 808 also includes circuitry to convert the filtered IF signal to obtain a second IF signal. The second IF BPF 828 is centered at a channel center frequency and filters the second IF signal to obtain the converted TX signal to be input into the mm-wave transceiver 820. The second IF BPF 828 can be used to remove harmonics of the IF RF signals, other out of band mixing spurs. It should be noted that the converted TX signals are not mm-wave RF signals, but are used as input to the mm-wave transceiver 820 that generates the mm-wave RF signals.

The mm-wave domain 804 includes an mm-wave transceiver 820 configured to be coupled to a multiple antenna elements 840 of a multi-element antenna (e.g., a phased array antenna or other beamforming antennas). The mm-wave transceiver 820 can be an integrated circuit that is configured to receive an input IF signal and transmit an mm-wave signal. The mm-wave transceiver 820 includes beamforming RFFE 806 for beamforming operations, as controlled by the controller 814 so that the mm-wave transceiver 820 can achieve beamforming operations, as done in with WLAN transceivers. The controller 814 may include hardware, firmware, software, or any combination thereof that can be used to generate control signals that facilitate the conversion of the WLAN signals produced by the IF transceiver 810 to the mm-wave signals for the mm-wave transceiver 820 and that facilitate the conversion of the mm-wave signals produced by the mm-wave transceiver 820 to the WLAN signals for the IF transceiver 810. For example, the controller 814 can generate control signals for beamforming and beam tracking operations. As described above, the signaling for beamforming and beam tracking portions of the IEEE 802.11ac and 802.11ad protocols are different. The controller 814 can be configured to convert the signaling between the two protocols.

In one embodiment, the filter-converter board 830 includes a first integrated circuit (IC) socket for the WLAN transceiver 812, a second IC socket for the controller 814, and a third socket for the mm-wave transceiver 820. The filter-converter board 830 may include terminals coupled to the multiple antenna elements 840. The multiple antenna elements 840 can be disposed on a surface of the filter-converter board 830, for example, as printed circuit board (PCB) antenna elements. Alternatively, the multiple antenna elements 840 can be disposed elsewhere within or on a surface of an electronic device or product in which the filter-converter board 830 is disposed. In some embodiments, the controller 814 and the conversion circuit 808 are integrated into an SoC. Alternatively, the controller 814 is a separate IC from the conversion circuit 808, but the operation of the controller 814 can be considered part of the conversion circuit 808 in the IF domain 803, instead of in the WLAN domain 802 with the IF transceiver 810. In some embodiments, the first IF BPF 816 may be located in the IF transceiver 810 in the WLAN domain 802, such as an integrated IF BPF in the WLAN transceiver 812. In some embodiments, the second IF BPF 828 may be integrated into in the mm-wave transceiver 820 in the mm-wave domain 804.

The controller 814 controls the WLAN transceiver 812 and the mm-wave transceiver 820. In a TX mode, the WLAN transceiver 812 outputs a TX signal that passes through the first IF BPF 816 in the IF domain 803. The first IF BPF 816 filters the TX signal to obtain a filtered TX signal. The conversion circuit 808 converts the filtered TX signal to obtain a converted TX signal. The converted TX signal passes through the second IF BPF 828 in the IF domain 803 and is input into the mm-wave transceiver 820 in the mm-wave domain 804.

The mm-wave transceiver 820 includes a local oscillator (LO) circuit 822, a LO BPF and LO driver amplifier (DA) 824, a mixer 826, a N-way divider/combiner 830, multiple TX chains 832 configured to be coupled to the multiple antenna elements 840, and multiple RX chains 834 configured to be coupled to the multiple antenna elements 840. The LO circuit 822 may be a VCO, a PLL synthesizer, or other types of frequency synthesizers or oscillators. The LO circuit 822 can be a synthesizer (VCO) as illustrated in the depicted embodiment. Alternatively, other LO circuits may be used. The N-way divider/combiner 830 and multiple TX chains 832 and multiple RX chains 834 may be considered part of beamforming RFFE circuitry 806. The N-way divider/combiner 830 splits a RF signals in N-paths, where N is the number of the multiple RF TX chains 832 in the mm-wave transceiver 820. The N-way divider/combiner 830 combines RF signals received in N-paths, where N is the number of the multiple RF TX chains 834. For example, N may be 108, 16, 32, or other numbers of ways depending on the number of supported RF chains in the mm-wave transceiver 820.

In the depicted embodiment, each of the multiple TX chains 832 includes a variable phase shifter, a filter, a VGA, and a power amplifier (PA). Similarly, each of the multiple RX chains 834 includes a variable phase shifter, a filter, a VGA, and a LNA. The multiple TX chains 832 and the multiple RX chains 834 may share common circuitry using a switch before and a switch after a pair of the VGA and PA in the respective one of the multiple TX chains 832 and a pair of the VGA and LNA in the respective one of the multiple RX chains 834.

The mixer 826 (also referred to as a frequency mixer, an up/down mixer) can be an electrical circuit that creates a new signal from two input signals. Mixers can be used to shift signals from one frequency range to another. In this embodiment, the mixer 826 down converts the TX signals, but as described below, can up convert RX signals. In the depicted embodiment, the mixer 826 produces a down-converted TX signal for beamforming by the beamforming RFFE 806. The RF signal output by the mixer 826 has a higher frequency than the converted TX signal output by the second IF BPF 828 in the IF domain 803 (also referred to as the IF signal input into the mixer 826). The RF signal output by the mixer 826 also has a higher frequency than the TX signal output by the IF transceiver 810 in the WLAN domain 802.

In this embodiment, the controller 814, the first IF BPF 816, the conversion circuit 808, and second IF BPF 828 can be considered part of the conversion circuitry (also referred to as frequency-spectrum converter or frequency-spectrum conversion circuitry), while the LO circuit 822, LO BPF and LO DA 824, and the mixer 826 are part of the mm-wave transceiver 820. The mm-wave transceiver 820 can be configured to receive an input IF signal in a certain frequency range and this IF signal is up-converted to mm-wave frequencies for transmission. Similarly, the RF signals with mm-wave frequencies are down-converted to IF signals in the certain frequency range. The TX output signals by the IF transceiver 810, however, may not be in the certain frequency range expected by the mm-wave transceiver 820. The conversion circuitry, including the conversion circuit 808 filter and convert the TX output signals by the IF transceiver 810 to obtain IF signals expected by the mm-wave transceiver 820.

In a TX path between the IF transceiver 820 and the mm-wave transceiver 820, the conversion circuit 808 is configured to convert first TX RF signals in a first frequency range (e.g., WLAN frequency range) to IF RF signals in a second frequency range (e.g., IF frequency range) and the mm-wave transceiver 820 converts the IF RF signals in the second frequency range to second TX RF signals in the mm-wave frequency range. In one embodiment, the IF RF signals are approximately 10.5 GHz. Alternatively, other frequencies can be used for the IF RF signals and the IF frequency range may vary between the WLAN frequency ranges in the WLAN domain 802 and the mm-wave frequency ranges in the mm-wave domain 804.

In a RX path between the IF transceiver 820 and the mm-wave transceiver 820 and the IF transceiver, the mm-wave transceiver 820 is configured to convert first RX RF signals in the mm-wave frequency range to IF RF signals in the second frequency range (e.g., IF frequency range) and the conversion circuit 808 converts the IF RF signals in the second frequency range to the first frequency range (e.g., WLAN frequency range).

In one embodiment, the IF frequency range (also referred to herein as first frequency range) is approximately 2.4 GHz to approximately 2.5 GHz, such as used in the Wi-Fi® technology in 2.4 GHz frequency band. The mm-wave frequency range (also referred to herein as second frequency range) is approximately 30 GHz to approximately 300 GHz. In another embodiment, the IF frequency range is approximately 5.7 GHz to approximately 5.8 GHz, such as used in the Wi-Fi® technology in 5 GHz frequency band and the mm-wave frequency range is approximately 30 GHz to approximately 300 GHz. The mm-wave frequency range may be any one of the following frequency bands: the 28 GHz band, the 37/42 GHz band (e.g., 37/42 GHz Bands (37.0-38.6 GHz and 42.0-42.5 GHz), the 60 GHz band (e.g., 57-64 GHz and 64-71 GHz or 57-64 GHz band), or the 70/80 GHz band (e.g., 71-76 GHz and 81-86 GHz or 71-86 GHz).

The radio 800 can be configured for single-channel, TDD communications at mm-wave frequencies, as described above with respect to FIG. 5. The radio 800 can be configured for multi-channel SISO, TDD communications at mm-wave frequencies, as described above with respect to FIG. 6. The radio 800 can be configured for multi-channel, SISO, FDD communications at mm-wave frequencies, as described above with respect to FIG. 7. The radio 800 can be configured for multi-channel, MIMO, TDD communications at mm-wave frequencies, as described above with respect to FIG. 6. The radio 800 can be configured for multi-channel, MIMO, FDD communications at mm-wave frequencies, as described above with respect to FIG. 7.

In another embodiment, the conversion circuitry is configured to receive a first RF signal in the first frequency range from the first transceiver and convert the first RF signal to a second RF signal in the mm-wave frequency range. The conversion circuitry may also be configured to receive a third RF signal in the mm-wave frequency range from the second transceiver and convert the third RF signal to a fourth RF signal in the first frequency range. The conversion circuitry, in a further embodiment, is configured to convert the first RF signal to a first IF signal to convert the first RF signal to the second RF signal and convert the third RF signal to a second IF signal to convert the third RF signal to the fourth RF signal, as described herein. The first transceiver may include multiple channels and multiple different channel filters, as described herein.

In various embodiments, the number of WLAN transceivers, WLAN transmitters, WLAN receivers, and mm-wave transceivers may vary. In one embodiment, the radio 800 includes M WLAN transceivers, where M is a positive integer; 2M mm-wave transceivers; 2M conversion circuits; and 2M channels, each of the 2M channels including one of the 2M conversion circuits and one of the 2M mm-wave transceivers. In another embodiment, the radio 800 includes M/2 WLAN transmitters, where M is a positive integer that is two or greater; M/2 WLAN receivers; M mm-wave transceivers; M conversion circuits; and M channels, each of the M channels including one of the M conversion circuits and one of the 2M mm-wave transceivers. In another embodiment, the radio 800 includes M WLAN transceivers, where M is a positive integer; M mm-wave transceivers; M conversion circuits, wherein the conversion circuitry is one of the 2M conversion circuits; and M channels, each of the M channels including one of the M conversion circuits and one of the 2M mm-wave transceivers. In another embodiment, the radio 800 includes M/2 WLAN transmitters, where M is a positive integer that is two or greater; M/2 WLAN receivers; M/2 mm-wave transceivers; M/2 conversion circuits; and M/2 channels, each of the M/2 channels including one of the M/2 conversion circuits and one of the M/2 mm-wave transceivers.

The radio 800 (as well as the other radios described herein) can provide an mm-wave radio architecture using 802.11ac protocol for multi-channel, concurrent operation. The embodiments described herein may allow for concurrent multi-channel operation without implementing TDMA scheduling. The embodiments described herein provide options to use same IF frequencies on the WLAN transceivers, reducing complexity and cost. The channel assignment and bandwidth can be reconfigured dynamically to mitigate interference conditions (co-channel interference (CCI) and adjacent-channel interference (ACI). CCI is the crosstalk from two different radio transmitters using the same frequency. ACI is the interference caused by extraneous power from a signal in an adjacent channel. The embodiments described herein support beamforming, which is native to both the 802.11ad and 802.11ac standards. The embodiments described herein support M×N MIMO operation, which is already implemented in many 802.11ac devices and can be leveraged for higher throughput and link reliability. The embodiments described herein may reduce risk associated with relying solely on chip vendors to support application specific needs.

FIG. 9 is a block diagram of an electronic device 900 with a WLAN transceiver, mm-wave transceiver, and frequency-conversion circuitry according to one embodiment.

The electronic device 900 includes one or more processor(s) 930, such as one or more CPUs, microcontrollers, field programmable gate arrays, or other types of processors. The electronic device 900 also includes system memory 906, which may correspond to any combination of volatile and/or non-volatile storage mechanisms. The system memory 906 stores information that provides operating system component 908, various program modules 910, program data 912, and/or other components. In one embodiment, the system memory 906 stores instructions of methods to control operation of the electronic device 900. The electronic device 900 performs functions by using the processor(s) 930 to execute instructions provided by the system memory 906.

The electronic device 900 also includes a data storage device 914 that may be composed of one or more types of removable storage and/or one or more types of non-removable storage. The data storage device 914 includes a computer-readable storage medium 916 on which is stored one or more sets of instructions embodying any of the methodologies or functions described herein. Instructions for the program modules 910 may reside, completely or at least partially, within the computer-readable storage medium 916, system memory 906 and/or within the processor(s) 930 during execution thereof by the electronic device 900, the system memory 906, and the processor(s) 930 also constituting computer-readable media. The electronic device 900 may also include one or more input devices 918 (keyboard, mouse device, specialized selection keys, etc.) and one or more output devices 920 (displays, printers, audio output mechanisms, etc.).

The electronic device 900 further includes a modem 922 to allow the electronic device 900 to communicate via a wireless connections (e.g., such as provided by the wireless communication system) with other computing devices, such as remote computers, an item providing system, and so forth. The modem 922 can be connected to one or more RF modules 986. The RF modules 986 may be a WLAN module, a WAN module, PAN module, GPS module, or the like. The RF modules 986 may be any of the radios described above with respect to FIGS. 3-8. The antenna structures (antenna(s) 984, 985, and 987) are coupled to the RF circuitry 983, which is coupled to the modem 922. The RF circuitry 983 may include radio front-end circuitry, antenna switching circuitry, impedance matching circuitry, or the like. In one embodiment, the RF circuitry 983 includes some of the components described above with respect to the radios as described in the various embodiments of FIGS. 3-8. The antennas 984 may be GPS antennas, NFC antennas, other WAN antennas, WLAN or PAN antennas, or the like. The modem 922 allows the electronic device 900 to handle both voice and non-voice communications (such as communications for text messages, multimedia messages, media downloads, web browsing, etc.) with a wireless communication system. The modem 922 may provide network connectivity using any type of mobile network technology including, for example, cellular digital packet data (CDPD), general packet radio service (GPRS), EDGE, universal mobile telecommunications system (UMTS), 1 times radio transmission technology (1×RTT), evaluation data optimized (EVDO), high-speed down-link packet access (HSDPA), Wi-Fi®, Long Term Evolution (LTE) and LTE Advanced (sometimes generally referred to as 4G), etc.

The modem 922 may generate signals and send these signals to antenna(s) 984 of a first type (e.g., WLAN 5 GHz), antenna(s) 985 of a second type (e.g., WLAN 2.4 GHz), and/or antenna(s) 987 of a third type (e.g., WAN), via RF circuitry 983, and RF module(s) 986 as descried herein. Antennas 984, 985, and 987 may be configured to transmit in different frequency bands and/or using different wireless communication protocols. The antennas 984, 985, and 987 may be directional, omnidirectional, or non-directional antennas. In addition to sending data, antennas 984, 985, and 987 may also receive data, which is sent to appropriate RF modules connected to the antennas. One of the antennas 984, 985, 987 may be any combination of the antenna structures described herein.

In one embodiment, the electronic device 900 establishes a first connection using a first wireless communication protocol, and a second connection using a different wireless communication protocol. The first wireless connection and second wireless connection may be active concurrently, for example, if an electronic device is receiving a media item from another electronic device (e.g., a mini-POP node) via the first connection) and transferring a file to another user device (e.g., via the second connection) at the same time. Alternatively, the two connections may be active concurrently during wireless communications with multiple devices. In one embodiment, the first wireless connection is associated with a first resonant mode of an antenna structure that operates at a first frequency band and the second wireless connection is associated with a second resonant mode of the antenna structure that operates at a second frequency band. In another embodiment, the first wireless connection is associated with a first antenna structure and the second wireless connection is associated with a second antenna. In other embodiments, the first wireless connection may be associated with content distribution within other devices in a network and the second wireless connection may be associated with serving a content file to a client consumption device, as described herein.

Though a modem 922 is shown to control transmission and reception via antenna (984, 985, 987), the electronic device 900 may alternatively include multiple modems, each of which is configured to transmit/receive data via a different antenna and/or wireless transmission protocol.

In the above description, numerous details are set forth. It will be apparent, however, to one of ordinary skill in the art having the benefit of this disclosure, that embodiments may be practiced without these specific details. In some instances, well-known structures and devices are shown in block diagram form, rather than in detail, in order to avoid obscuring the description.

Some portions of the detailed description are presented in terms of algorithms and symbolic representations of operations on data bits within a computer memory. These algorithmic descriptions and representations are the means used by those skilled in the data processing arts to most effectively convey the substance of their work to others skilled in the art. An algorithm is here, and generally, conceived to be a self-consistent sequence of steps leading to a desired result. The steps are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the above discussion, it is appreciated that throughout the description, discussions utilizing terms such as "inducing," "parasitically inducing," "radiating," "detecting," "determining," "generating," "communicating," "receiving," "disabling," or the like, refer to the actions and processes of a computer system, or similar electronic computing device, that manipulates and transforms data represented as physical (e.g., electronic) quantities within the computer system's registers and memories into other data similarly represented as physical quantities within the computer system memories or registers or other such information storage, transmission or display devices.

Embodiments also relate to an apparatus for performing the operations herein. This apparatus may be specially constructed for the required purposes, or it may comprise a general-purpose computer selectively activated or reconfigured by a computer program stored in the computer. Such a computer program may be stored in a computer readable storage medium, such as, but not limited to, any type of disk including floppy disks, optical disks, CD-ROMs and magnetic-optical disks, read-only memories (ROMs), random access memories (RAMs), EPROMs, EEPROMs, magnetic or optical cards, or any type of media suitable for storing electronic instructions.

The algorithms and displays presented herein are not inherently related to any particular computer or other apparatus. Various general-purpose systems may be used with programs in accordance with the teachings herein, or it may prove convenient to construct a more specialized apparatus to perform the required method steps. The required structure for a variety of these systems will appear from the description below. In addition, the present embodiments are not described with reference to any particular programming language. It will be appreciated that a variety of programming languages may be used to implement the teachings of the present invention as described herein. It should also be noted that the terms "when" or the phrase "in response to," as used herein, should be understood to indicate that there may be intervening time, intervening events, or both before the identified operation is performed.

It is to be understood that the above description is intended to be illustrative, and not restrictive. Many other embodiments will be apparent to those of skill in the art upon reading and understanding the above description. The scope of the present embodiments should, therefore, be determined with reference to the appended claims, along with the full scope of equivalents to which such claims are entitled.

What is claimed is:

1. A radio configured for single channel, multi-channel, single-input-single-output (SISO), multiple-input-multiple output (MIMO), and beamforming communications at millimeter wave (mm-wave) frequencies, the radio comprising:
   an interface coupled to receive baseband information from a processor;
   a zero intermediate frequency (ZIF) transceiver comprising an input and an output, the input being coupled to the interface to receive the baseband information and the output to generate a wireless local area network (WLAN) signal in a WLAN frequency spectrum;

a millimeter-wave (mm-wave) transceiver comprising an input and an output, the input being coupled to the output of the ZIF transceiver and the output being coupled to a phased-array antenna, wherein the ZIF transceiver and the mm-wave transceiver are coupled in series between the interface and the phased-array antenna; and frequency-spectrum converter circuity coupled in series between the output of the ZIF transceiver and the input of the mm-wave transceiver, the frequency-spectrum converter circuity to:
receive the WLAN signal from the output of the ZIF transceiver;
convert the WLAN signal to an intermediate frequency (IF) signal; and
output the IF signal to the input of the mm-wave transceiver, wherein the mm-wave transceiver is to receive at the input the IF signal and output a mm-wave signal based on the IF signal, wherein the mm-wave signal, when applied to the phased-array antenna, causes the phased-array antenna to radiate electromagnetic energy in a mm-wave frequency spectrum, wherein the IF signal has a frequency that is greater than frequencies in the WLAN frequency spectrum and less than frequencies in the mm-wave frequency spectrum.

2. The radio of claim 1, wherein the frequency-spectrum converter circuity comprises:
a local oscillator (LO) circuit configured to generate a LO signal;
a mixer coupled to the LO circuit;
an IF bandpass filter coupled to a first port of the mixer;
a RF bandpass filter coupled to a second port of the mixer, the mixer to up-convert a TX signal on the first port or down-covert a RX signal on the second port based on the LO signal; and
a controller coupled to the ZIF transceiver, the LO circuit, and the mm-wave transceiver, the controller to control the ZIF transceiver, LO circuit, and the mm-wave transceiver to operate in one of a plurality of operational modes of the radio, the plurality of operational modes comprising a single-channel operational mode and at least one of a multi-channel operational mode, a SISO operational mode, or a MIMO operational mode to communicate data via the phased-array antenna at mm-wave frequencies in the mm-wave frequency spectrum.

3. The radio of claim 1, wherein the mm-wave transceiver comprises a plurality of RF chains, each of the plurality of RF chains comprising components coupled between an input port and an output port, the components configured to phase shift, filter, and amplify an RF signal, wherein the frequency-spectrum converter circuity further comprises an N-way divider/combiner coupled between a RF bandpass filter and the input ports of the plurality of RF chains.

4. The radio of claim 1, wherein the ZIF transceiver comprises:
a plurality of channels, each of the plurality of channels is selectable according to a channel assignment scheme; and
a plurality of channel filters, each of the plurality of channel filters is reconfigurable to support a plurality of different multi-channel bandwidth schemes, wherein, in a first period, a first channel of the plurality of channels is selected and a first channel filter of the plurality of channel filters is reconfigured to a first multi-channel bandwidth scheme of the plurality of different multi-channel bandwidth schemes to filter the first channel according to a first channel bandwidth, and wherein in a second period, a second channel of the plurality of channels is selected and a second channel filter of the plurality of channel filters is reconfigured to the first multi-channel bandwidth scheme to filter the second channel according to the first channel bandwidth.

5. An electronic device comprising:
a first transceiver configured to generate RF signals in a first frequency range based on baseband information received from a processing device;
a second transceiver configured to generate RF signals in a millimeter-wave (mm-wave) frequency range, the second transceiver is coupled to a multi-element antenna; and
conversion circuitry coupled between the first transceiver and the second transceiver, wherein the first transceiver, the conversion circuitry, and the second transceiver are coupled in series between the processing device and the multi-element antenna, the conversion circuitry is configured to:
receive a first RF signal in the first frequency range from an output of the first transceiver;
convert the first RF signal to a second RF signal in the mm-wave frequency range;
output the second RF signal to an input of the second transceiver;
receive a third RF signal in the mm-wave frequency range from an output of the second transceiver;
convert the third RF signal to a fourth RF signal in the first frequency range; and
output the fourth RF signal to an input of the first transceiver.

6. The electronic device of claim 5, wherein:
to convert the first RF signal to the second RF signal, the conversion circuity is further configured to convert the first signal to a first intermediate frequency (IF) signal in an IF frequency range; and
to convert the third RF signal to the fourth RF signal, the conversion circuitry is further configured to convert the third RF signal to a second IF signal in the IF frequency range.

7. The electronic device of claim 5, wherein the first transceiver comprises:
a plurality of channels; and
a plurality of channel filters.

8. The electronic device of claim 5, wherein:
the first transceiver is a zero-intermediate frequency (ZIF) transceiver that transmits a wireless local area network (WLAN) signal to the conversion circuitry; the conversion circuitry comprises:
an IF band-pass filter (BPF) that is centered at a channel center frequency and filters the WLAN signal to obtain a filtered IF signal;
a mixer that converts the filtered IF signal to obtain a second TX RF signals; a RF BPF that filters the mm-wave RF signal to remove harmonics of the mm-wave RF signal, other out of band mixing spurs, or both;
a frequency synthesizer of mm-wave that generates an Local Oscillator (LO) signal; and
a filter and driver amplifier that filters the LO signal to obtain a filtered LO signal that drives a LO port of the mixer.

9. The electronic device of claim 5, wherein the second transceiver comprises:

a plurality of RF chains, each of the plurality of RF chains to phase shift, filter, and amplify the second RF signal; and an N-way divider/combiner to divide the second RF signal by N-ways, where N is a number of the plurality of RF chains in the second transceiver, wherein N is a positive integer that is two or greater.

10. The electronic device of claim 5, wherein the conversion circuitry is further configured to convert a first TX RF signal to a first intermediate frequency (IF) signal in an IF frequency range and divide the IF signal N-ways to obtain the second RF signal in the mm-wave frequency range, where N is a number of RF chains in the second transceiver, each of the RF chains to phase shift, filter, and amplify the second RF signal, wherein N is a positive integer that is two or greater.

11. The electronic device of claim 5, wherein the conversion circuitry is further configured to combine the third RF signal received at one of the multiple antenna elements of the multi-element antenna with another RF signal received at another one of the multiple antenna elements of the multi-element antenna as combined RF signals in the mm-wave frequency range and convert the combined RF signals to a second IF signal in an IF frequency range.

12. The electronic device of claim 5, wherein the first frequency range is approximately 2.4 GHz to approximately 5.8 GHz, and wherein the mm-wave frequency range is approximately 30 GHz to approximately 300 GHz.

13. The electronic device of claim 5, further comprising:
M wireless local area network (WLAN) transceivers, where M is a positive integer, and wherein the first transceiver is one of the M WLAN transceivers;
2M mm-wave transceivers, wherein the second transceiver is one of the 2M mm-wave transceivers;
2M conversion circuits, wherein the conversion circuitry is one of the 2M conversion circuits; and
2M channels, each of the 2M channels comprising one of the 2M conversion circuits and one of the 2M mm-wave transceivers.

14. The electronic device of claim 5, further comprising:
M/2 wireless local area network (WLAN) transmitters, where M is a positive integer that is two or greater;
M/2 WLAN receivers, wherein the first transceiver is one of the M/2 WLAN transmitters or one of the M/2 WLAN receivers;
M mm-wave transceivers, wherein the second transceiver is one of the 2M mm-wave transceivers;
M conversion circuits, wherein the conversion circuitry is one of the 2M conversion circuits; and
M channels, each of the M channels comprising one of the M conversion circuits and one of the 2M mm-wave transceivers.

15. The electronic device of claim 5, further comprising:
M wireless local area network (WLAN) transceivers, where M is a positive integer, and wherein the first transceiver is one of the M WLAN transceivers;
M mm-wave transceivers, wherein the second transceiver is one of the 2M mm-wave transceivers;
M conversion circuits, wherein the conversion circuitry is one of the 2M conversion circuits; and
M channels, each of the M channels comprising one of the M conversion circuits and one of the 2M mm-wave transceivers.

16. The electronic device of claim 5, further comprising:
M/2 wireless local area network (WLAN) transmitters, where M is a positive integer that is two or greater;
M/2 WLAN receivers, wherein the first transceiver is one of the M/2 WLAN transmitters or one of the M/2 WLAN receivers;
M/2 mm-wave transceivers, wherein the second transceiver is one of the M/2 mm-wave transceivers;
M/2 conversion circuits, wherein the conversion circuitry is one of the M/2 conversion circuits; and
M/2 channels, each of the M/2 channels comprising one of the M/2 conversion circuits and one of the M/2 mm-wave transceivers.

17. The electronic device of claim 5, further comprising:
a first integrated circuit (IC) comprising the first transceiver;
a second IC comprising the second transceiver; and
a filter-converter board comprising the conversion circuitry and a controller, wherein the conversion circuitry comprises:
a first IF band-pass filter (BPF);
a second IF BPF; and
a first circuit coupled between the first IF BPF and the second IF BFP, and wherein the controller is configured to control the first transceiver and the second transceiver to operate in one of a plurality of operational modes of the radio, the plurality of operational modes comprising at least one of a single-channel operational mode, a multi-channel operational mode, a single-input-single-output (SISO) operational mode, or a multi-input-multi-output (MIMO) operational mode to communicate data with beamforming operation via the multi-element antenna in the mm-wave frequency.

18. A wireless communication device comprising:
a processing device;
a first multi-element antenna;
a first radio coupled to the processing device, the first radio comprising:
a first transceiver comprising a first port:
a second transceiver comprising a second port, wherein the first transceiver is configured to generate a first radio frequency (RF) signal in a first frequency range based on baseband information from the processing device, and wherein the second transceiver is configured to receive a third RF signal in a millimeter-wave (mm-wave) frequency range via the first multi-element antenna; and
conversion circuitry coupled between the first port of the first transceiver and the second port of the second transceiver, wherein the first transceiver, the conversion circuitry, and the second transceiver are coupled in series between the processing device and the first multi-element antenna, wherein the conversion circuitry is configured to:
convert the first RF signal to a second RF signal in the mm-wave frequency range as an input to the second port of the second transceiver; and
convert the third RF signal to a fourth RF signal in the first frequency range as an input to the first port of the first transceiver.

19. The wireless communication device of claim 18, wherein:
to convert the first RF signal to the second RF signal, the conversion circuity is further configured to convert the first RF signal to a first intermediate frequency (IF) signal in an IF frequency range; and to convert the third RF signal to the fourth RF signal, the conversion circuitry is further configured to convert the third RF signal to a second IF signal in the IF frequency range.

20. The wireless communication device of claim 18, wherein the first transceiver comprises:
 a plurality of channels; and
 a plurality of channel filters.

* * * * *